(12) United States Patent
Larson et al.

(10) Patent No.: US 10,809,304 B1
(45) Date of Patent: Oct. 20, 2020

(54) ADAPTIVE POWER ESTIMATION SYSTEM

(71) Applicant: Snap Inc., Santa Monica, CA (US)

(72) Inventors: Nicholas Larson, Playa Vista, CA (US); Gerald Nilles, Culver City, CA (US); Michael Wollman, Boulder, CO (US)

(73) Assignee: Snap Inc., Santa Monica, CA (US)

( * ) Notice: Subject to any disclaimer, the term of this patent is extended or adjusted under 35 U.S.C. 154(b) by 39 days.

(21) Appl. No.: 15/994,664

(22) Filed: May 31, 2018

Related U.S. Application Data

(60) Provisional application No. 62/513,298, filed on May 31, 2017.

(51) Int. Cl.
| | | |
|---|---|---|
| *G01R 31/374* | (2019.01) | |
| *G06F 1/16* | (2006.01) | |
| *G06F 13/24* | (2006.01) | |
| *G01R 31/36* | (2020.01) | |
| *G01R 31/389* | (2019.01) | |
| *G01R 31/3828* | (2019.01) | |

(52) U.S. Cl.
CPC ....... *G01R 31/374* (2019.01); *G01R 31/3648* (2013.01); *G01R 31/389* (2019.01); *G01R 31/3828* (2019.01); *G06F 1/163* (2013.01); *G06F 13/24* (2013.01); *G06F 2213/2424* (2013.01)

(58) Field of Classification Search
CPC .................................................. G01R 31/374
USPC ......................................................... 320/132
See application file for complete search history.

(56) References Cited

U.S. PATENT DOCUMENTS

2019/0113774 A1* 4/2019 Anderson .............. G02C 5/143

\* cited by examiner

*Primary Examiner* — Edward Tso
*Assistant Examiner* — Ahmed H Omar
(74) *Attorney, Agent, or Firm* — Schwegman Lundberg & Woessner, P.A.

(57) ABSTRACT

Systems, devices, media, and methods are presented for adaptively estimating power. The systems and methods measure an electrical potential of a power source coupled to a wearable computing device and determine a current power consumption on the power source. The systems and methods identify a current slope value mapping the electrical potential to an estimated capacity percentage based on the measured electrical potential. The systems and methods determine a correction value based on the current power consumption and the current slope value and generate a current capacity value from the electrical potential and the correction value. The systems and methods cause presentation of a representation of the current capacity value within a power indicator and control one or more processes operating within the wearable computing device based on the current capacity value.

20 Claims, 13 Drawing Sheets

ADAPTIVE POWER ESTIMATION SYSTEM

PRIORITY CLAIM

This application claims the priority benefit of U.S. Provisional Application No. 62/513,298, filed May 31, 2017, which is hereby incorporated herein by reference in its entirety.

TECHNICAL FIELD

Embodiments of the present disclosure relate generally to adaptively estimating power. More particularly, but not by way of limitation, the present disclosure addresses systems and methods for adaptively estimating available power and modulating active processes in response to the estimation.

BACKGROUND

Current wearable computing devices often estimate an amount of power available in a power source connected to the wearable computing device. For example, smartphones often provide a battery power estimation represented by a battery icon shown within a user interface. Current systems include power estimation functions, which often rely entirely on a graph or curve mapping an open circuit voltage (OCV) with a percent state of charge (SoC). Reliance on such a graph or curve often introduces error, inaccuracies, or imprecision into the estimation of available power. Incorporating sensors or other specialized components into wearable computing devices to correct the error, inaccuracies, or imprecision may be impractical given sizes and dimensions of current wearable computing devices, as well as component distribution within such devices. The impracticality may be compounded by the cost, availability, or power constraints associated with suitable sensors or specialized components.

BRIEF DESCRIPTION OF THE DRAWINGS

Various ones of the appended drawings merely illustrate example embodiments of the present disclosure and should not be considered as limiting its scope.

Figure 1:
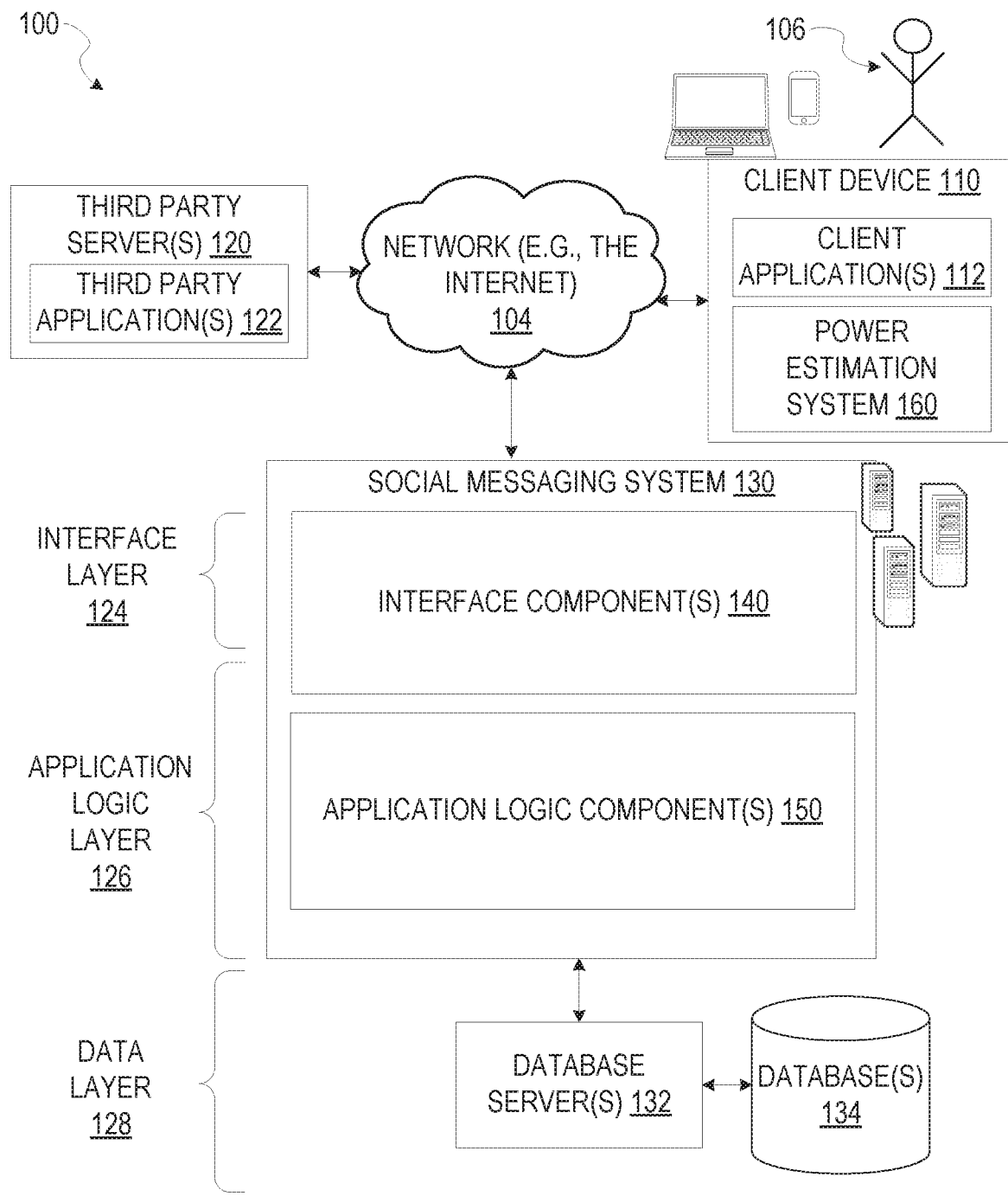
FIG. 1 is a block diagram illustrating a network system, according to some example embodiments.

The headings provided herein are merely for convenience and do not necessarily affect the scope or meaning of the terms used.

DETAILED DESCRIPTION

The description that follows includes systems, methods, techniques, instruction sequences, and computing machine program products illustrative of embodiments of the disclosure. In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

Devices, such as smartphones and wearable computers (e.g., smart watches and head-mounted displays), rely on internal or mounted power sources, such as batteries, for untethered operation. Some applications or operations consume more power from the power source than others. Further, some applications or operations (e.g., updating, shutting down, and connectivity searches) employ guard bands for operation. Guard bands may prevent initiation of power-intensive operations, which are likely to trigger a shut down or consume remaining power in the power source prior to completion. Given a finite amount of power stored in many power sources and use of guard bands, wearable computing devices often use power estimation functions to provide a rough estimate of an available power or battery life of the power source at any given time. Current systems and methods for power estimation often include errors which prevent accurate power estimation. The errors and inaccuracies of current systems and methods also often result in fluctuating estimations, resulting in large changes in estimated battery life, such as a first estimation of fifty percent battery life and a second estimation of fifteen percent battery life being presented within a single sixty second time interval. Further, current systems and methods for power estimation often provide inconsistent power estimations, such as showing a first battery life estimation at thirty percent and a second battery life estimation of sixty percent without an intervening charging cycle.

In addressing these issues, among others, embodiments of the present disclosure describe a power estimation system using a novel framework to more accurately estimate available power and power consumption for a power source of a user's wearable computing device. In some example embodiments, the power estimation system identifies characteristics of the power source used as constants, measures a current power consumption for the power source, and estimates a current capacity (e.g., battery life) for the power source using a correction value based, in part, on the characteristics of the power source. In some example embodiments, the power estimation system identifies the power source characteristics and generates an adjustment table tailored to a specified power source of a specified wearable computing device. In some instances, the power estimation system periodically modifies the adjustment table to compensate for changes to the specified power source based on time, temperature, and other factors. The power estimation system may also generate new adjustment tables on identifying a newly installed or connected power source.

Previous power estimation methods and systems for computing devices often use a single voltage measurement or estimation. These previous power estimation methods then compare the single voltage with an OCV/SoC curve. The OCV/SoC curve may be general, related to a total capacity of a general power source. OCV and SoC do not have a linear relationship. Given the variations in the OCV/SoC relationship, predicting a value for the SoC (e.g., a battery life percentage) may produce varying amounts or degrees of error. The error often increases depending on a position of the OCV on the OCV/SoC curve. For example, at low voltages, a slope of the OCV/SoC curve is large, providing a higher relative resolution when compared to medium or higher voltages. As the voltage increases, the OCV/SoC curve may become shallower, providing variability in resolution of the curve.

Previous power estimation methods often include error based on parasitic resistance of computing devices. Power sources often have a significant amount of parasitic resistance. Equivalent series resistance (ESR) of a power source at room temperature may be greater than 400 mΩ. A measured instantaneous voltage may thus be impacted by the current. For example, if a battery is at fifty percent or 3.83V and is loaded by 150 mA, previous power estimation methods may cause the sensed voltage to drop to 3.77V, corresponding to twenty-five percent battery life. An immediate drop from fifty percent to twenty-five percent battery life, as a result of current usage within normal parameters, may result in an unfavorable user experience. Further, previous power estimation systems and methods lacked state monotonicity. For example, when the 150 mA load, in the above-referenced example, is released, the power source may gradually relax. The voltage may rise back up to 3.83V from the 3.77V position. Previous power estimation methods and systems often revise the lowered battery life of twenty-five percent back up to fifty percent, causing user confusion and causing variability in applications or operations allowed to execute based on guard bands.

Some previous power estimation methods and systems rely on specialized sensors to sense power source current in addition to voltage to address some of the errors and inaccuracies described above. Component cost, component distribution, and sizes and dimensions of wearable computing devices may preclude incorporation of the specialized sensors. Other previous power estimation techniques attempt to correct the errors and inaccuracies described above using computationally intensive operations which may result in reduced power capacity and increased power consumption while generating power estimates.

Example embodiments of the present disclosure measure an electrical potential of a power source of a wearable computing device and determine a current power consumption. Using the electrical potential, embodiments of the present disclosure may identify a current slope mapping the electrical potential to an estimated capacity percentage of the power source. Based on the current power consumption and the current slope value, embodiments of the present disclosure may determine a correction value and generate a current capacity value using the electrical potential value and the correction value.

In some instances, example embodiments of the present disclosure generate a novel data structure tailored to a specified power source of a wearable computing device. In some embodiments, the novel data structure takes the form of an adjustment table. The adjustment table may incorporate a series resistance value and a total capacity value for the specified power source. The adjustment table may also incorporate slope values mapping electrical potential values to estimated capacity percentages for the specified power source. The adjustment table may be periodically modified or modified in response to triggering events to maintain a tailored accuracy of the adjustment table to the specified power source. In some embodiments, the adjustment table includes correction values mapped to or derived from two or more of the series resistance value, the total capacity value, the slope values, and electrical potential values for the specified power source. In such instances, the power estimation system may generate the correction value by accessing the adjustment table and selecting a correction value corresponding to one or more of a measured electrical potential and a current power consumption for the specified power source.

In some instances, during normal operation of the wearable computing device, components of the power estimation system operate to estimate battery life (e.g., a current power capacity) of the power source and display the battery life estimation within a power indicator coupled to the wearable computing device. The battery life may also be displayed within a user interface of a mobile computing device coupled to and communicating with the wearable computing device. The power estimation system may cooperate with the wearable computing device to trigger operations, such as shut down procedures or low power mode operation, in response to the estimated battery life reaching a selected threshold. The power estimation system may operate periodically, intermittently, based on a schedule, based on triggering events, continuously, in any other manner suitable for one or more of the wearable computing device, the current battery life, an environment of the wearable computing device, an operating state of the wearable computing device, or any other suitable consideration.

Example embodiments of the present disclosure provide an accurate power source estimation. In some instances, the power estimation system of the present disclosure enables accurate power estimation using relatively low power consumption and processing resources. Further, the power estimation system may enable power estimation which maintains consistency or monotonicity in light of variations to current flow from or into the power source. Additionally, the power estimation system enables higher confidence levels for enabling, disabling, and triggering operations with respect to battery life, such as operations or applications associated with guard bands. For example, embodiments of the present disclosure may enable accurate estimation of power for shut-off procedures, over-air updates, and connectivity or network searching. Further, example embodiments may enable accurate estimation of power despite temperature variations in one or more of the wearable computing device, the power source, or an ambient environment surrounding the power source or the wearable computing device.

The above is one specific example. The various embodiments of the present disclosure relate to devices and instructions by one or more processors of a device to adaptively estimate power of a power source. A power estimation system is described that adaptively estimates available power and modulates active processes in response to the estimation.

FIG. 1 is a network diagram depicting a network system 100 having a client-server architecture configured for exchanging data over a network, according to one embodiment. For example, the network system 100 may be a messaging system where clients communicate and exchange data within the network system 100. The data may pertain to various functions (e.g., sending and receiving text and media communication, determining geolocation, etc.) and aspects (e.g., transferring communications data, receiving and transmitting indications of communication sessions, etc.) associated with the network system 100 and its users. Although illustrated herein as client-server architecture, other embodiments may include other network architectures, such as peer-to-peer or distributed network environments.

As shown in FIG. 1, the network system 100 includes a social messaging system 130. The social messaging system 130 is generally based on a three-tiered architecture, consisting of an interface layer 124, an application logic layer 126, and a data layer 128. As is understood by skilled artisans in the relevant computer and Internet-related arts, each component or engine shown in FIG. 1 represents a set of executable software instructions and the corresponding hardware (e.g., memory and processor) for executing the instructions, forming a hardware-implemented component or engine and acting, at the time of the execution of instructions, as a special purpose machine configured to carry out a particular set of functions. To avoid obscuring the inventive subject matter with unnecessary detail, various functional components and engines that are not germane to conveying an understanding of the inventive subject matter have been omitted from FIG. 1. Of course, additional functional components and engines may be used with a social messaging system, such as the social messaging system 130 illustrated in FIG. 1, to facilitate additional functionality that is not specifically described herein. Furthermore, the various functional components and engines depicted in FIG. 1 may reside on a single server computer or client device, or may be distributed across several server computers or client devices in various arrangements. Moreover, although the social messaging system 130 is depicted in FIG. 1 as a three-tiered architecture, the inventive subject matter is by no means limited to such an architecture.

As shown in FIG. 1, the interface layer 124 consists of interface component(s) (e.g., a web server) 140, which receives requests from various client-computing devices and servers, such as client device 110 executing client application(s) 112, and third-party server(s) 120 executing third party application(s) 122. In response to received requests, the interface component(s) 140 communicates appropriate responses to requesting devices via a network 104. For example, the interface component(s) 140 can receive requests such as Hypertext Transfer Protocol (HTTP) requests, or other web-based, Application Programming Interface (API) requests.

Figure 2A:
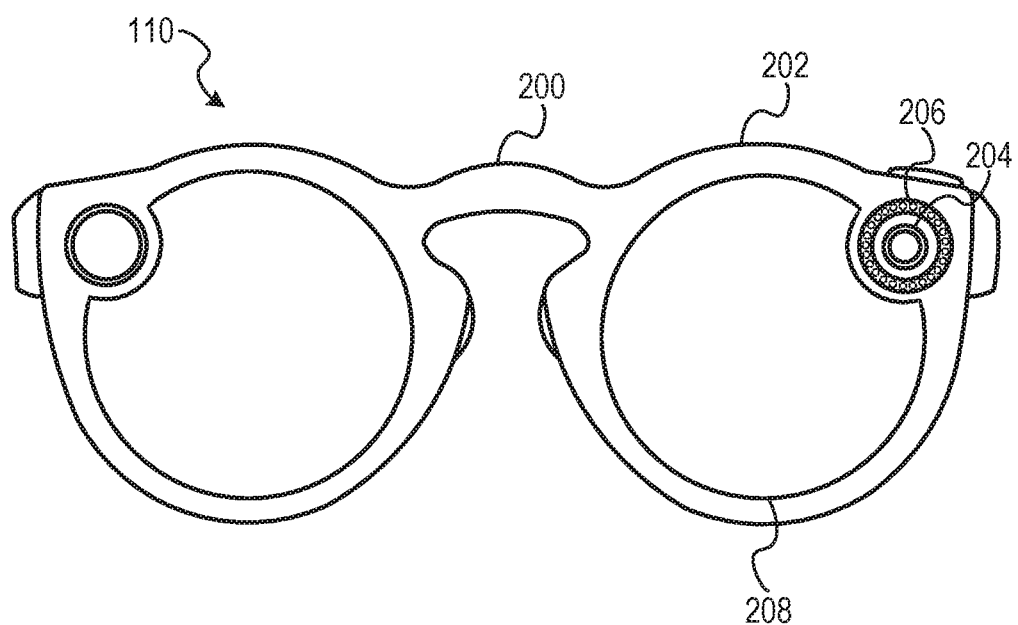
FIG. 2A is a diagram illustrating a wearable computing device, according to some example embodiments.

In some embodiments, the client device 110 can execute image or video stream capture operations via an image capture device coupled to or integral within the client device 110. As shown in FIG. 2A below, some example embodiments of the client device 110 comprise a wearable electronic device, such as smart glasses. In some embodiments, the client device 110 (e.g., a smartphone) can execute conventional web browser applications or applications (also referred to as "apps") that have been developed for a specific platform to include any of a wide variety of mobile computing devices and mobile-specific operating systems (e.g., IOS™, ANDROID™, WINDOWS® PHONE). Further, in some example embodiments, the client device 110 forms all or part of power estimation system 160 such that components of the power estimation system 160 configure the client device 110 to perform a specific set of functions with respect to operations of the power estimation system 160.

In an example, the client device 110 (e.g., the client device 110 shown in FIG. 2A) executes the client application(s) 112 for capturing images or video streams and transferring or otherwise communicating the captured images or video streams to another device. The client device 110 executing the client application(s) 112 can provide functionality to present information to a user 106 and communicate via the network 104 to exchange information with a mobile computing device such as a smart phone and, via the mobile computing device with the social messaging system 130. Further, in some examples, the client device 110 executes functionality of the power estimation system 160 to adaptively estimate power of a power source integral or otherwise coupled to the client device 110. In some example embodiments, the power estimation system 160 executes functionality to adaptively estimate available power, such as battery life, and modulate active, pending, terminated, or suspended processes in response to the estimation.

In embodiments where the client device 110 is a wearable computing device, such as smart glasses depicted in FIG. 2A, the client device comprises an image capture device, an input device, a power indicator, and communications components. The input device may cause the image capture device to capture images or video streams. The communications device may transfer the captured images or video streams to another mobile computing device. The power indicator may provide representations of available power or battery capacity estimated by the power estimation system 160.

In embodiments where the client device 110 is a smart phone, the client device 110 may comprise a computing device that includes at least a display and communication capabilities with the network 104 to access the social messaging system 130, other client devices, and third-party server(s) 120. Client devices 110 comprise, but are not limited to, remote devices, work stations, computers, general purpose computers, Internet appliances, hand-held devices, wireless devices, portable devices, wearable computers (e.g., smartwatches, fitness trackers, smart glasses, or head-mounted displays), implantable devices, cellular or mobile phones, personal digital assistants (PDAs), smartphones, tablets, ultrabooks, subnotebooks, ultraportables, netbooks, laptops, hybrid or convertable laptops, desktops, multi-processor systems, microprocessor-based or programmable consumer electronics, game consoles, set-top boxes, network PCs, mini-computers, and the like. User 106 can be a person, a machine, or other means of interacting with the client device 110. In some embodiments, the user 106 interacts with the social messaging system 130 via the client device 110. The user 106 may not be part of the network system 100, but may be associated with the client devices 110.

As shown in FIG. 1, the data layer 128 has database server(s) 132 that facilitate access to information storage repositories or database(s) 134. The database(s) 134 are storage devices that store data, such as member profile data, social graph data (e.g., relationships between members of the social messaging system 130), image modification preference data, accessibility data, and other user data.

An individual can register with the social messaging system 130 to become a member of the social messaging system 130. Once registered, a member can form social network relationships (e.g., friends, followers, or contacts) on the social messaging system 130 and interact with a broad range of applications provided by the social messaging system 130.

The application logic layer 126 includes various application logic components 150, which, in conjunction with the interface component(s) 140, generate various user interfaces with data retrieved from various data sources or data services in the data layer 128. Individual application logic components 150 may be used to implement the functionality associated with various applications, services, and features of the social messaging system 130. For instance, a social messaging application can be implemented with at least a portion of the application logic components 150. The social messaging application provides a messaging mechanism for users of the client devices 110 to send and receive messages that include text and media content such as pictures and video. The client devices 110 may access and view the messages from the social messaging application for a specified period of time (e.g., limited or unlimited). In an example, a particular message is accessible to a message recipient for a predefined duration (e.g., specified by a message sender) that begins when the particular message is first accessed. After the predefined duration elapses, the message is deleted and is no longer accessible to the message recipient. Of course, other applications and services may be separately embodied in their own application logic components 150.

As illustrated in FIG. 1, the social messaging system 130 may include at least a portion of the power estimation system 160 capable of adaptively estimating power for a power source. Similarly, the client device 110 includes at least a portion of the power estimation system 160, as described above. In other examples, client device 110 may include the entirety of the power estimation system 160. In instances where the client device 110 includes a portion of (or all of) the power estimation system 160, the client device 110 can work alone or in cooperation with the social messaging system 130 to provide the functionality of the power estimation system 160 described herein.

In some embodiments, the social messaging system 130 may be an ephemeral message system that enables ephemeral communications where content (e.g., video clips or images) are deleted following a deletion trigger event such as a viewing time or viewing completion. In such embodiments, a device uses the various components described herein within the context of any of generating, sending, receiving, or displaying aspects of an ephemeral message. For example, a device implementing the power estimation system 160 may adaptively estimate power for a power source coupled to the device. The device may access, download, transmit, or modify content in response to the power estimation as a part of a generation and distribution of content for an ephemeral message.

In FIG. 2A, an example embodiment of the client device 110 is depicted. As shown, a front plan view of the client device 110 shows a pair of smart glasses. The smart glasses 200 may comprise an eyewear body 202. The eyewear body 202 can include one or more temples and a frame. The smart glasses 200 can additionally include articulated joints, onboard electronic components 204 and 206.

The eyewear body 202 may be configured for wearing by a user to hold one or more optical elements 208 mounted on the eyewear body 202 within a field of view of a user. More particularly, the frame can be configured to hold the one or more optical elements 208, while the temples can be connected to the frame at the respective articulated joints. The temples can comprise elongate members having core wires, power sources, or electrical components therein.

The temple is illustrated in the wearable condition while the temple is illustrated in the collapsed condition in FIG. 2A. As shown in FIG. 2A, the temple can be connected to a right end portion of the frame by the articulated joint. Similarly, another temple can be connected to a left end portion of the frame by the articulated joint. The right end portion of the frame can carry the onboard electronic components 204 and 206 by housing the onboard electronic components 204 and 206 therein, and the left end portion can carry additional onboard electronic components by housing the onboard electronic components therein.

The onboard electronic components 204 and 206 can be carried by the eyewear body 202 (e.g., either or both of the temple(s) and/or the frame). The onboard electronic components 204 and 206 can comprise a heat source that generates heat during electrically powered operation. As previously discussed, the onboard electronic components 204 and 206 can comprise an image capture device 204 and a power indicator 206. In some embodiments, onboard electronic components may also comprise a power source, power and communication related circuitry, communication devices (e.g., a microphone, sensors, etc.), display devices, a computer, a memory, modules, and/or the like.

Figure 2B:
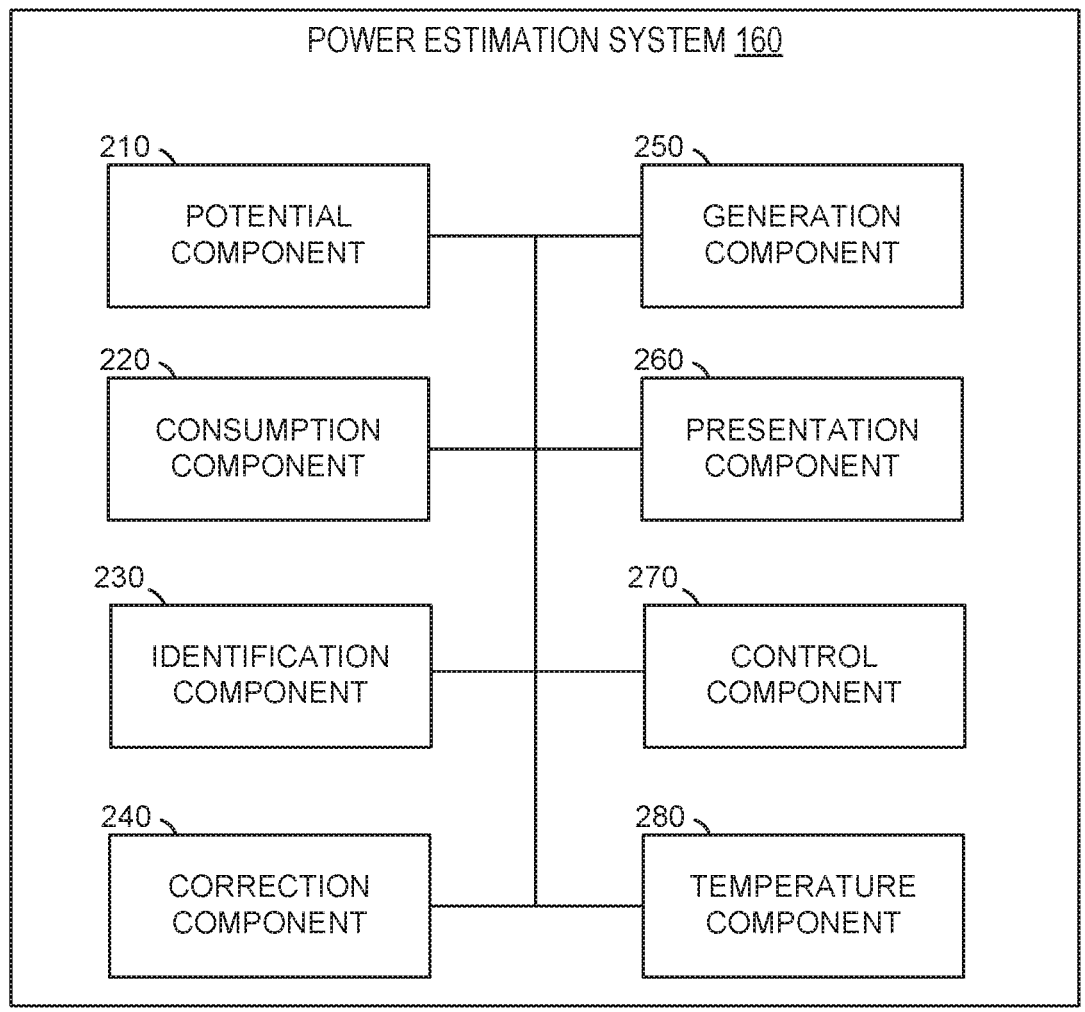
FIG. 2B is a diagram illustrating a power estimation system within the wearable computing device of FIG. 2A, according to some example embodiments.

In FIG. 2B, in various embodiments, the power estimation system 160 can be implemented as a standalone system or implemented in conjunction with the client device 110, and is not necessarily included in the social messaging system 130. The power estimation system 160 is shown to include a potential component 210, a consumption component 220, an identification component 230, a correction component 240, a generation component 250, a presentation component 260, a control component 270, and a temperature component 280. All, or some, of the components 210-280, communicate with each other, for example, via a network coupling, shared memory, and the like. Each component of components 210-280 can be implemented as a single component, combined into other components, or further subdivided into multiple components. Other components not pertinent to example embodiments can also be included, but are not shown.

The potential component 210 may be a module, component, or set of components configured to measure an electrical potential of a power source. The potential component 210 may measure electrical potential; identify factors, events, or conditions affecting measurement of electrical potential; correct for one or more of the identified conditions; and perform other operations as described below in more detail. The consumption component 220 may be a module, component, or set of components configured to determine a current power consumption. In some embodiments, the current power consumption is determined from one or more of instantaneous voltage, a current, and a sampling rate. The consumption component 220 may also perform additional or related operations or functionality as described herein. The identification component 230 identifies slope values mapping open current voltage to percentage states of charge. In some embodiments, the identification component 230 identifies the slope values by accessing established curves, graphs, data tables, or other suitable information to identify the slope values.

The correction component 240 may be a module, component, or set of components configured to determine correction values for generating or estimating a current power capacity for a power source. The correction component 240 may be configured to modify previously generated correction values, and generate or modify correction values using an adjustment table tailored to a specific power source. The generation component 250 may be a module, component, or set of components configured to generate current capacity values indicating one or more of a current charge, current battery life, a percentage thereof, or any other suitable indication of power remaining in a power source. In some embodiments, the generation component 250 enforces monotonicity in presenting a representation of the current power capacity of the power source. The generation component 250 may also generate adjustment tables tailored to represent characteristics of a power source and used to generate or determine the current power capacity of the power source. The presentation component 260 may be a module, component, or set of components configured to generate and cause presentation of values, such as the current capacity value described herein, within the power indicator 206 of the smart glasses 200. The control component 270 may be a module, component, or set of components configured to identify and modify execution of operations within the smart glasses 200, based on the current capacity value. The temperature component 280 may be a module, component, or set of components configured to measure temperatures of one or more components of the smart glasses 200, the power source, and combinations thereof.

Figure 3:
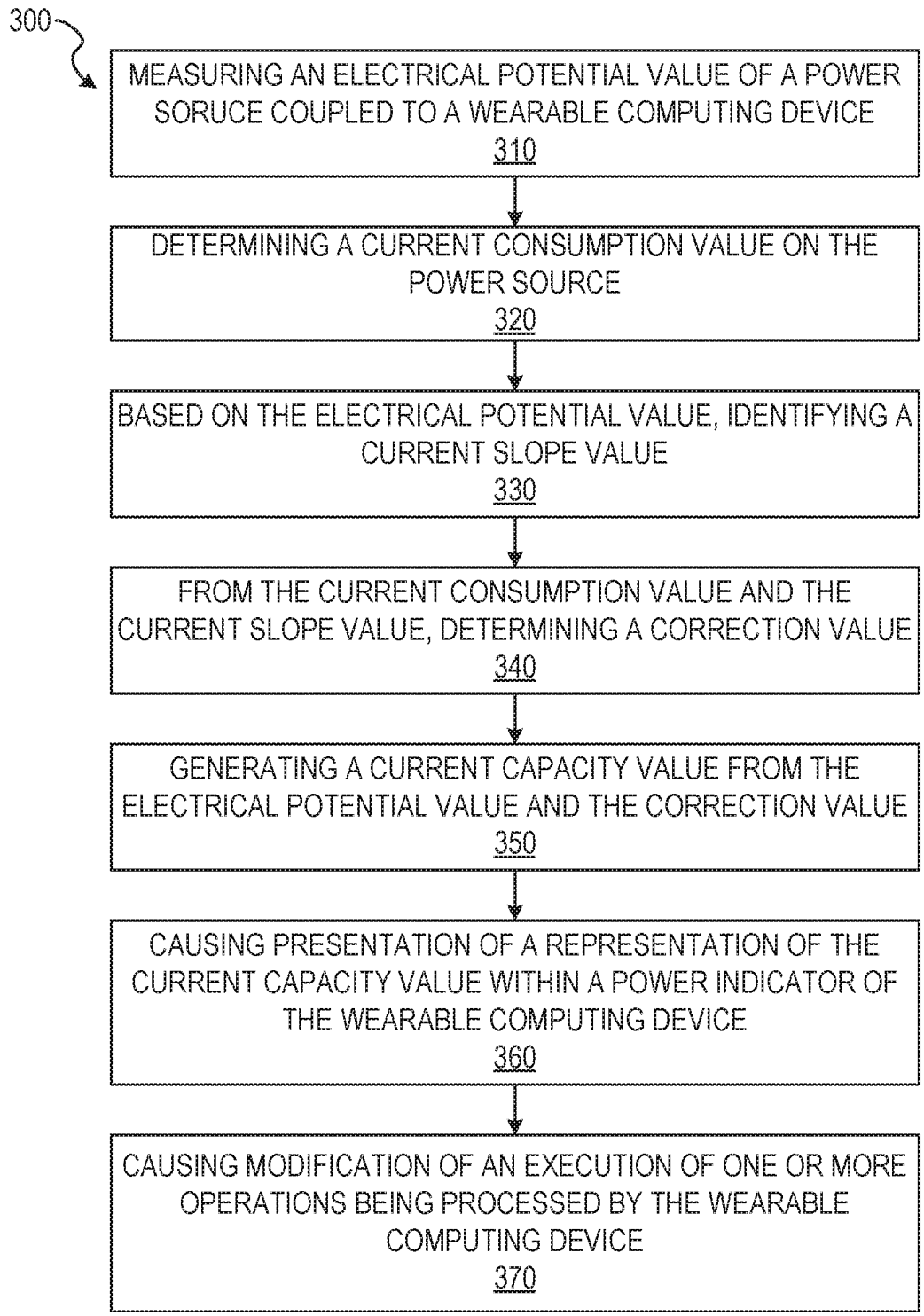
FIG. 3 is a flow diagram illustrating an example method for adaptively estimating power, according to some example embodiments.

FIG. 3 depicts a flow diagram illustrating an example method 300 for adaptively estimating power of a power source. The operations of method 300 may be performed by components of the power estimation system 160, and are so described below for purposes of illustration.

In operation 310, the potential component 210 measures an electrical potential of a power source coupled to the smart glasses 200. The electrical potential may be represented by or converted into an electrical potential value. In some embodiments, the smart glasses 200 is a client device (e.g., client device 110). The electrical potential of the power source may be measured as an open circuit voltage (OCV). In such instances, the electrical potential may be measured as a difference of electrical potential between two terminals of the power source. In some instances, the potential component 210 measures the electrical potential when no external load is present or flowing between the terminals.

In operation 320, the consumption component 220 determines a current power consumption on the power source. The current power consumption may be represented by or converted into a current consumption value. In some embodiments, the consumption component 220 determines the current power consumption based on an instantaneous voltage measured, estimated, or otherwise determined from the power source. As will be discussed in more detail below, the consumption component 220 may determine the current consumption value as a product of a current for the power source and a sampling rate.

In some instances, the power source current may be identified as incoming current or outflowing current. The consumption component 220 may estimate the current as an incoming current or outflowing current by measuring an instantaneous voltage for the power source and comparing the instantaneous voltage to the electrical potential value measured in operation 310. Where the instantaneous voltage of the power source is greater than the electrical potential value, the current may be an incoming current, flowing into the power source. Where the instantaneous voltage is less than the electrical potential value, the current may be an outflowing current, flowing out of the power source.

A magnitude of the power source current may be determined from a voltage differential and an equivalent series resistance (ESR) of the power source. In some instances, the voltage differential is divided by the ESR of the power source to generate the magnitude of the power source current. In some embodiments, the voltage difference is calculated as a difference between the electrical potential value, measured in operation 310, and the instantaneous voltage. As described above, the power source value may be represented by Equation 1, below.

$$E_{[mAh]} = I_{PS} \times t_{sampling\ rate} \qquad \text{Equation 1}$$

In Equation 1, $E_{[mAh]}$ represents the current consumption value, $I_{PS}$ represents the power source current (e.g., milliampere), and $t_{sampling\ rate}$ represents a unit of time (e.g., hour) defining a sampling measurement.

In operation 330, the identification component 230 identifies a current slope value. The current slope value may map the electrical potential value to an estimated capacity percentage for the power source. In some embodiments, the identification component 230 identifies the current slope value based on the electrical potential value measured in operation 310. In some instances, the identification component 230 identifies the current slope value from a data structure (e.g., a graph, plotting, or data table) comprising a curve for a relationship between open current voltage (OCV) and percentage state of charge (SoC) for the power source. In some embodiments, the slope of the curve may be represented by Equation 2, below.

$$\text{slope} = \left[\frac{\delta V_{char}}{\delta SoC_{char}}\right] \qquad \text{Equation 2}$$

In operation 340, the correction component 240 determines a correction value. In some embodiments, the correction component 240 determines the correction value based on the current power consumption, determined in operation 320, and the current slope value, identified in operation 330. In some embodiments, the correction component 240 determines the correction value using Equation 3, below.

$$\delta OCV = \frac{E_{[mAh]}}{Cap_{[mAh]}} \times \left[\frac{\delta V_{char}}{\delta SoC_{char}}\right]_{V=OCV_{n-1}} \qquad \text{Equation 3}$$

In Equation 3, $$\left[\frac{\delta V_{char}}{\delta SoC_{char}}\right]_{V=OCV_{n-1}}$$

represents the current slope value identified for the electrical potential value measured in operation 310. $Cap_{[mAh]}$ may represent a total capacity of the power source.

In operation 350, the generation component 250 generates a current capacity value from the electrical potential value and the correction value. In some embodiments, the current capacity value represents a current charge, current battery life, a current charge percentage, or a current battery life percentage for the power source. In some embodiments, the generation component 250 generates the current capacity value using Equation 4, below.

$$OCV_n = OCV_{n-1} + \delta OCV \qquad \text{Equation 4}$$

In some embodiments, $OCV_n$ represents the current capacity value, $OCV_{n-1}$ represents the electrical potential value measured in operation 310, and $\delta OCV$ represents the correction value. The correction value may be determined similarly to or the same as described with respect to operation 340. In some instances, the current capacity value is generated or converted to a percentage, or any other suitable indication of an available portion or amount of power remaining in the power source.

Figure 4:
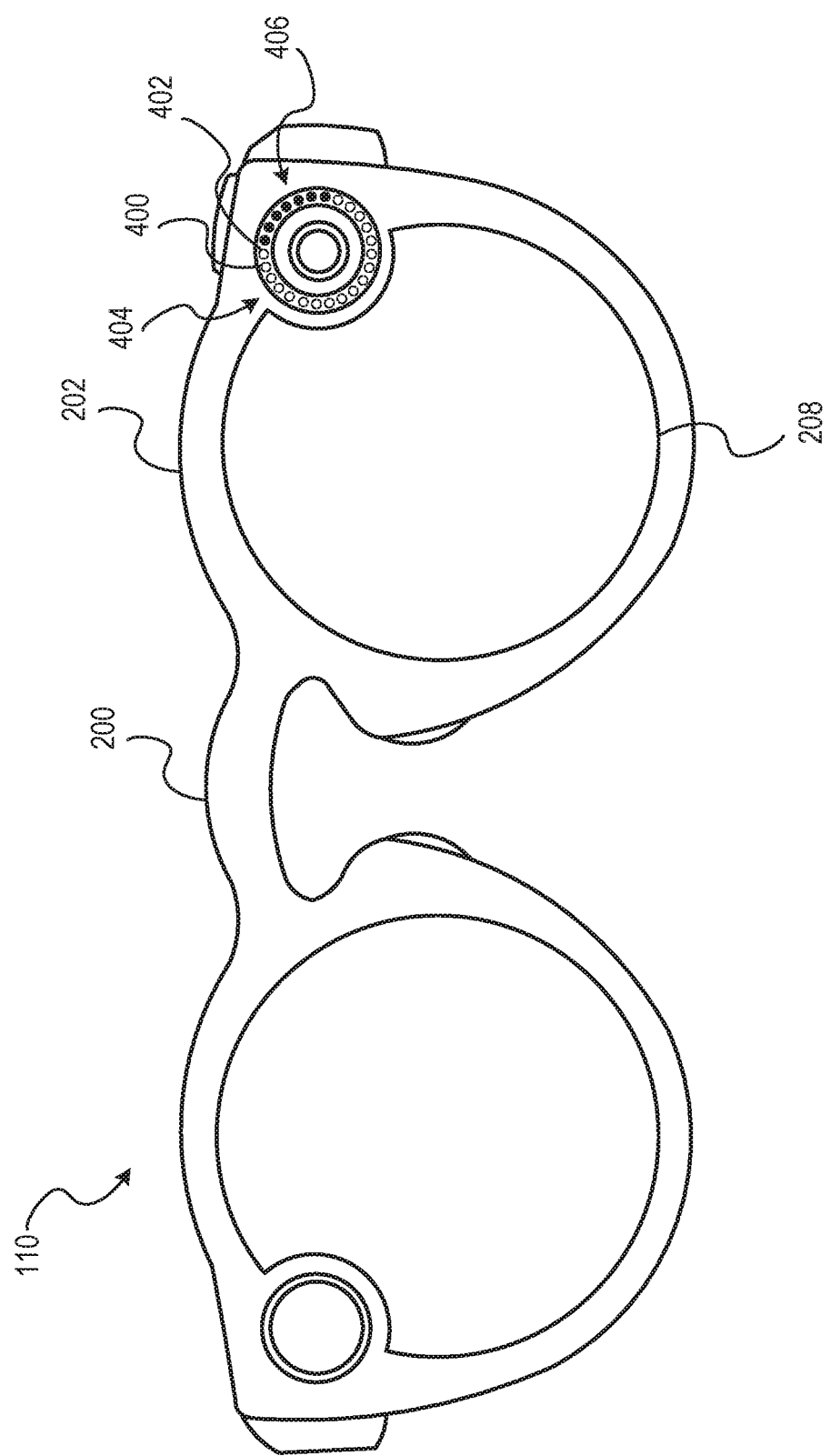
FIG. 4 is a user interface diagram depicting a representation of a current capacity value responsive to an adaptive estimation of power, according to some example embodiments.

In operation 360, the presentation component 260 causes presentation of a representation of the current capacity value within the power indicator 206 of the smart glasses 200. In some instances, the current capacity value may be presented within a user interface of an application displayed and operating on a mobile computing device or within a graphical user interface depicted on an output device of the mobile computing device (e.g., a smartphone). In some embodiments, the representation of the current capacity is presented according to a device setting of the smart glasses 200. For example, as shown in FIG. 4, the representation of the current capacity value is presented in power indicator 400 as a physical or visual representation of the current capacity value. As shown in FIG. 4, the power indicator may comprise a plurality of individual indicators 402. The individual indicators may be individual light-emitting diodes (LED). In some instances, the LEDs may be illuminated cooperatively, individually, or otherwise to operate as the power indicator 400 and display a visual indication of one or more of a power level or a notification regarding a power level of the smart glasses 200. As shown, one or more of the individual indicators may be illuminated or otherwise indicate a portion of the current capacity value determined by the generation component 350.

As shown, the portion of individual indicators illuminated may correspond to a percentage of power or battery life currently available within the power source of the smart glasses 200. For example, as shown in FIG. 4, the current capacity value may be determined or estimated to be seventy-five percent of a total capacity of the power source of the smart glasses 200. The current capacity value of seventy-five percent may be represented by the plurality of individual indicators 402 by a first portion 404 of the plurality of individual indicators being illuminated, and a second portion 406 of the plurality of individual indicators being dimmed or unilluminated. In the above example, the first portion 404 may correspond to approximately seventy-five percent of the plurality of individual indicators. The second portion 406 may correspond to approximately twenty-five percent of the plurality of individual indicators. Although described as a physical or visual representation, in some embodiments, the current capacity value may be presented as a graphical value or representation, a numerical value, a text string, an alphanumeric text string, a set of bars, a set of dots, a set of ideograms (e.g., one or more emojis), or any other suitable presentation within a user interface of a mobile computing device or an application operating within and displayed on a mobile computing device. The application may be an application of or representing the ephemeral messaging system, described herein.

In operation 370, the control component 270 causes modification of an execution of one or more operations being processed or executed by the smart glasses 200. The control component 270 may activate, suspend, or terminate any operations being processed by the smart glasses 200 in response to generation of the current capacity value. In some embodiments, the control component 270 modifies execution of one or more operations, while allowing other operations to continue execution by the smart glasses 200. In some instances, the control component 270 generates one or more notifications in response to the current capacity value, as shown in FIG. 4. With respect to the plurality of individual indicators 402, the notification may be a pulse, blink, intermittent illumination, gradual illumination, progressive illumination of portions of the plurality of individual indicators, or any other suitable representation of a notification relating to the current capacity value.

For example, the control component 270 may generate a low power notification when the current capacity value falls below a threshold. The control component 270 may also generate charged notifications, low power termination notifications, or resumption notifications upon the current capacity value rising above a threshold after a charging cycle is applied to the power source. Low power termination notifications may indicate a low power mode or a power saving mode has terminated based on a sufficient charge or battery life of the power source, indicated by the current capacity value exceeding the threshold. Resumption notifications may indicate one or more operations resuming execution after a prior suspension.

In some embodiments, operation 370 comprises one or more additional operations or sub-operations. In some instances, during operation 370, the control component 270 identifies one or more processes operating within the smart glasses 200, such as image capture operations, video stream capture operations, or audio stream capture operations. Processes may also comprise communication operations transmitting an image, a video stream, or an audio stream from the smart glasses 200 to a mobile computing device. The one or more operations may be associated with at least one operation characteristic or operation setting. In some instances, the at least one operation characteristic or operation setting is a power or power source capacity characteristic indicating a capacity threshold (e.g., a predetermined capacity value) below which the at least one operation is to be suspended.

In response to identifying the one or more processes, the control component 270 generates an interrupt suspending at least one of the one or more processes operating within the smart glasses 200 based on the current capacity value. In some instances, the control component 270 compares the operation characteristic (e.g., capacity threshold) of each operation to the current capacity value. An operation may be suspended by the control component 270 where the current capacity value is below a capacity threshold associated with the operation. In some instances, the control component 270 prioritizes suspension of operations or processes. For example, where a first process of the one or more processes is part of an active image capture operations of the smart glasses 200, the control component 270 may maintain the first process for a period of time during which the smart glasses 200 is receiving data from the image capture device 204.

In response to maintaining or prioritizing the first process, the control component 270 may select a second process for suspension. The control component 270 may suspend the second process despite the current capacity value being above the capacity threshold of the second process. In such instances, the control component 270 suspends processes of the one or more processes for which the current capacity value is below the respective capacity threshold, excluding the first process. The control component 270 may determine that a subsequent power consumption remains above a predetermined level, given the current capacity value. The control component 270 may then select the second process for suspension, as discussed above.

Figure 5:
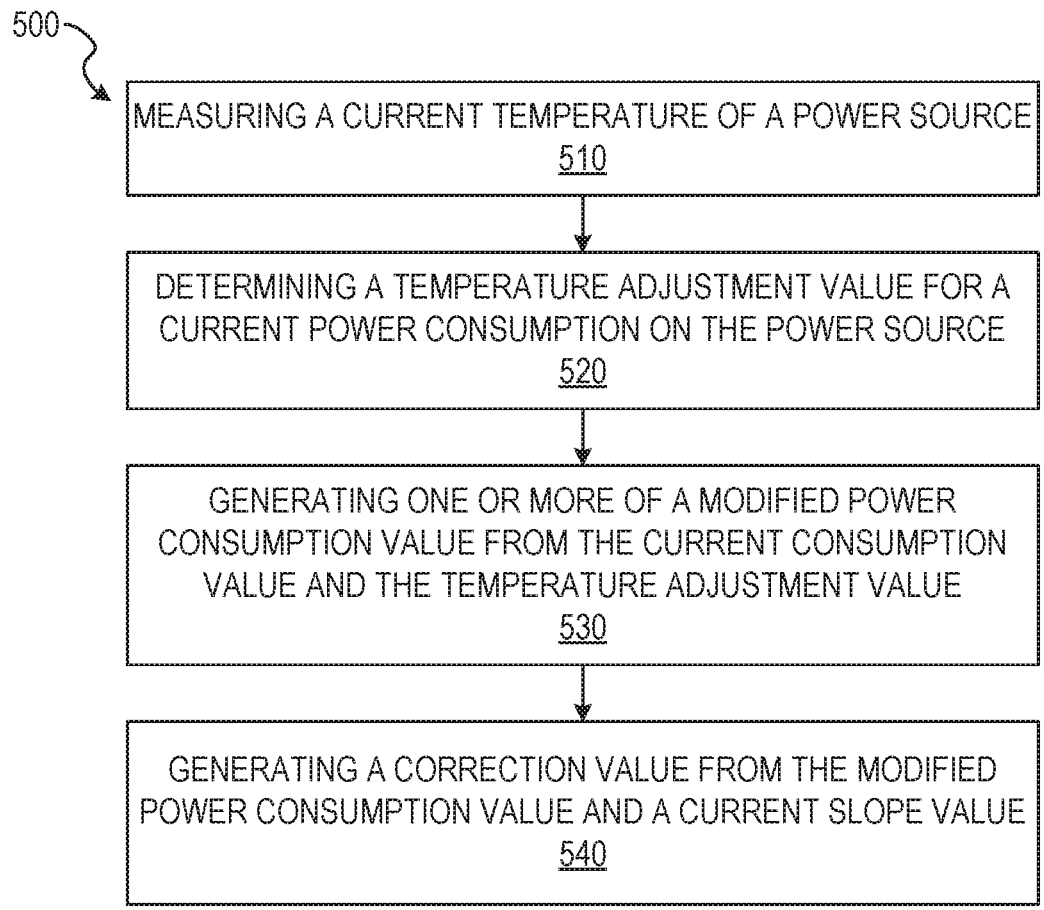
FIG. 5 is a flow diagram illustrating an example method for adaptively estimating power, according to some example embodiments.

FIG. 5 depicts a flow diagram illustrating an example method 500 for adaptively estimating power of a power source. The operations of method 500 may be performed by components of the power estimation system 160. In some instances, certain operations of the method 500 may be performed using one or more operations of the method 300 or as sub-operations of one or more operations of the method 300, as will be explained in more detail below.

In operation 510, the temperature component 280 measures a current temperature of the power source. In some embodiments, the temperature component 280 measures the current temperature of the power source using one or more internal temperature sensors cooperating with or part of the temperature component 280. The one or more temperature sensors may be internal to the smart glasses 200, coupled to the power source, or internal to the power source. The temperature sensor may be a thermistor terminal or sensor internal to the power source, a thermistor sensor internal to the smart glasses 200 but external to the power source, or any other suitable temperature sensor within the smart glasses 200 or power source capable of measuring a temperature of the power source. The temperature sensor may measure the temperature of the power source in any suitable temperature unit. The measurement of the temperature sensor may then be converted into a suitable unit, value, reading, or data type for use by the temperature component.

In operation 520, the temperature component 280 determines a temperature adjustment value for the current power consumption on the power source. In some example embodiments, the temperature component 280 determines the temperature adjustment value based on the current temperature. The temperature component 280 may determine the temperature adjustment value from a set of predetermined values based on the current temperature. In some instances, the temperature component 280 determines the temperature adjustment value algorithmically, based on one or more of the current temperature, one or more characteristics of the power source (e.g., total capacity and ESR), the current consumption value, the electrical potential value, combinations thereof, or any other suitable values representing one or more of the smart glasses 200 and the power source.

In instances employing the set of predetermined values, the temperature component 280 may compare the current temperature with a temperature or temperature range in the set of predetermined values. Upon identifying a match between the current temperature and a predetermined value, or identifying that the current temperature falls within a temperature range of a predetermined value, the temperature component selects a corresponding temperature adjustment value associated with the identified predetermined value.

In some instances, the set of predetermined values includes a first value indicating a temperature range below five degrees Celsius, a second value indicating a temperature range between five degrees Celsius and fifteen degrees Celsius, and a third value indicating temperatures greater than fifteen degrees Celsius. The first value, second value, and third value may be associated with a first temperature adjustment value, a second temperature adjustment value, and a third temperature adjustment value, respectively. In some instances, the temperature adjustment value is a predetermined value. The temperature adjustment value may also be a multiplicative value, or any other suitable value, to be applied to the correction value determined in operation 340, described above. In some instances of the temperature adjustment values being multiplicative values, the first temperature adjustment value may be a tripling value, multiplying the correction value by a factor of three. The second temperature adjustment value may be a doubling value, multiplying the correction value by a factor of two. The first temperature adjustment value may be a single value, multiplying the correction value by a factor of one.

In operation 530, the consumption component 220 generates one or more of a modified power consumption value from the current consumption value and the temperature adjustment value. The modified power consumption value may be based on the temperature modifying a resistance value for the power source. The modified power consumption value may be derived from two or more of the current consumption value, a current value (e.g., a current I measured in Amperes) of the battery, a resistance value for the power source, and the temperature adjustment value.

In operation 540, the correction component 240 generates the correction value, or a modified correction value, from the modified power consumption value and the current slope value. In such embodiments, the correction component 240 may generate the modified correction value in a manner similar to or the same as described above with respect to operation 340, using the modified power consumption value.

In some embodiments, described in more detail below, the correction component 240 generates the modified correction value using a value derived from an adjustment table, an instantaneous voltage (e.g., an instantaneous voltage for the power source measured by an analog-to-digital converter), the electrical potential value for the power source, and the temperature adjustment value. In some instances, the adjustment table value may be selected from the adjustment table based on the electrical potential value, measured in operation 310. A difference between the instantaneous voltage and the electrical potential value may be divided by the adjustment table value. The resulting quotient may then be modified by the temperature adjustment value to produce the modified correction value. For example the quotient may be multiplied by the temperature adjustment value.

Figure 6:
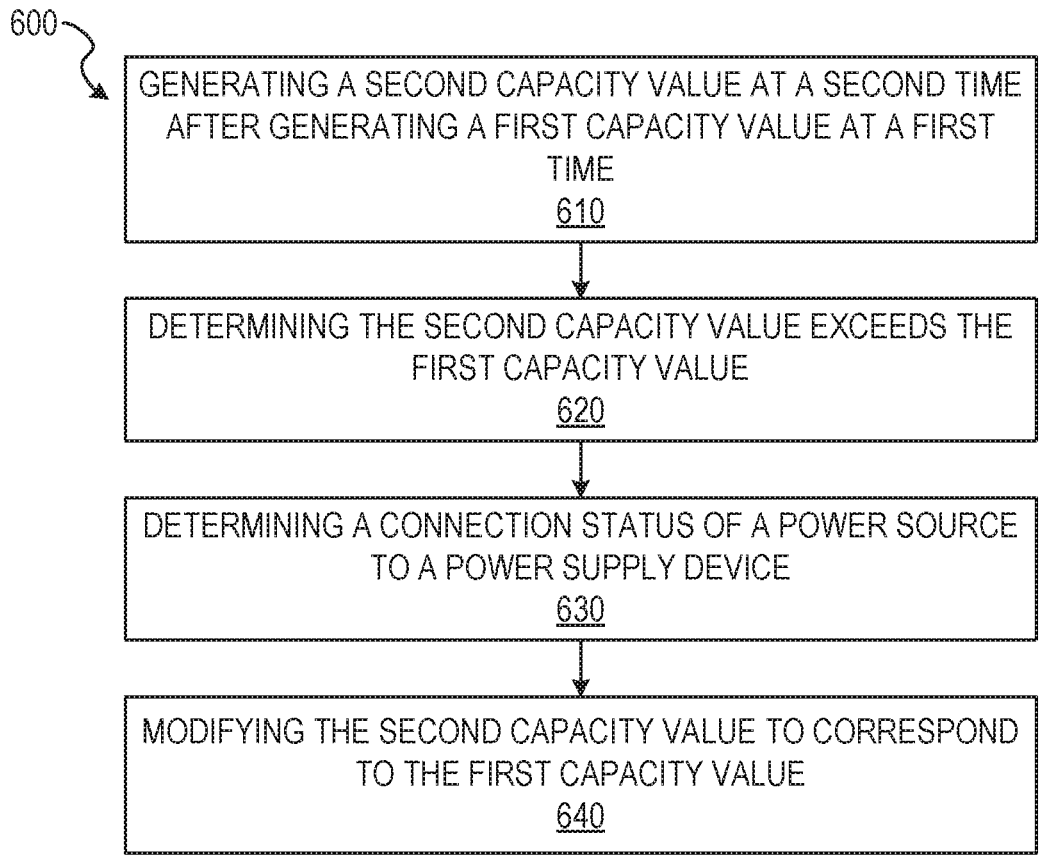
FIG. 6 is a flow diagram illustrating an example method for adaptively estimating power, according to some example embodiments.

FIG. 6 depicts a flow diagram illustrating an example method 600 for adaptively estimating power of a power source. The operations of method 600 may be performed by components of the power estimation system 160. In some instances, certain operations of the method 600 may be performed using one or more operations of the method 300 or the method 500 or as sub-operations of one or more operations of the method 300 or the method 500, as will be explained in more detail below. For example, the method 600 may be performed as a part of the method 300.

In some embodiments, the current capacity value generated in operation 350 is a first capacity value generated at a first time. In operation 610, the generation component 250 generates a second capacity value at a second time. The second capacity value may be generated from a second electrical potential value, a second power consumption value, a second slope value, and a second correction value. The second electrical potential value may be measured in a manner similar to or the same as described above with respect to operation 310. The second power consumption value may be determined in a manner similar to or the same as described above with respect to operation 320. The second slope value may be identified in a manner similar to or the same as described above with respect to operation 330. The second correction value may be determined in a manner similar to or the same as described above with respect to operation 340. The second electrical potential value, the second power consumption value, the second slope value, and the second correction value may be respectively determined at or proximate to the second time for which the second capacity value is generated.

In operation 620, the generation component 250 determines that the second capacity value exceeds the first capacity value. In some embodiments, the generation component 250 compares the first capacity value and the second capacity value to determine whether the second capacity value exceeds the first capacity value. The comparison may be a simple arithmetic comparison, an algorithmic comparison incorporating additional information, or any other suitable comparison. For example, the generation component 250 may determine that a second capacity value indicating a fifty-five percent charge of the power source exceeds a first capacity value indicating a thirty-five percent charge of the power source.

In operation 630, the control component 270 determines a connection status of the power source to a power supply device. The power supply device may be an external power source such as an electrical outlet in a wall, an external battery, a battery case, a generator, or any other suitable power source external to the smart glasses 200 and capable of supplying power to the power source. In some embodiments, the connection status indicates the power source is unconnected to the power supply device. The control component 270 may determine the connection status based on a charge cycle indicator. In some embodiments, upon detecting connection of the smart glasses 200 to an external power source and the power source receiving power from the external power source, one or more component of the smart glasses 200 generates a charge cycle indicator. In some embodiments, the charge cycle indicator represents at least a partial charging of the power source via the external power source. The control component 270 may determine the connection status by identifying or receiving the charge cycle indicator. Absence of a charge cycle indicator, in some instances, may indicate a negative connection status, indicating the power source has not engaged in a charging cycle between a current time and a time associated with determination of the first capacity value.

In some embodiments, the control component 270 determines a connection status of the power source by querying the power source or querying a data structure external to the power source. The control component 270 may determine whether the power source received power from an external power source based on the query of the power source or the external data structure. Upon determining the power source has not received power from the external power source, the control component 270 determines a negative connection status for the power source, indicating the power source is unconnected to the power supply device and has not received a connection to the power supply device in a time between the current time and a time associated with generating the first capacity value.

In some embodiments, a microcontroller is coupled to or otherwise in communication with the control component 270. The microcontroller may include a general purpose input/output (GPIO) input. The GPIO may determine or otherwise indicate when a charger (e.g., a power cord) connects the power source to an external power source or a power supply device. For example, embodiments incorporating the GPIO may be represented by pseudo code shown below.

if (algoOCV_mV<reportedOCV_mV||chargerConnected)
{
reportedOCV_mV=algoOCV_mV;
}

In operation 640, the generation component 250 modifies the second capacity value to correspond to the first capacity value. In some embodiments, operation 640 is represented by the pseudo code defined above. The generation component 250 may enforce monotonicity of the power source and generated capacity values by ensuring the reported SoC does not increase unless a charger is connected.

Figure 7:
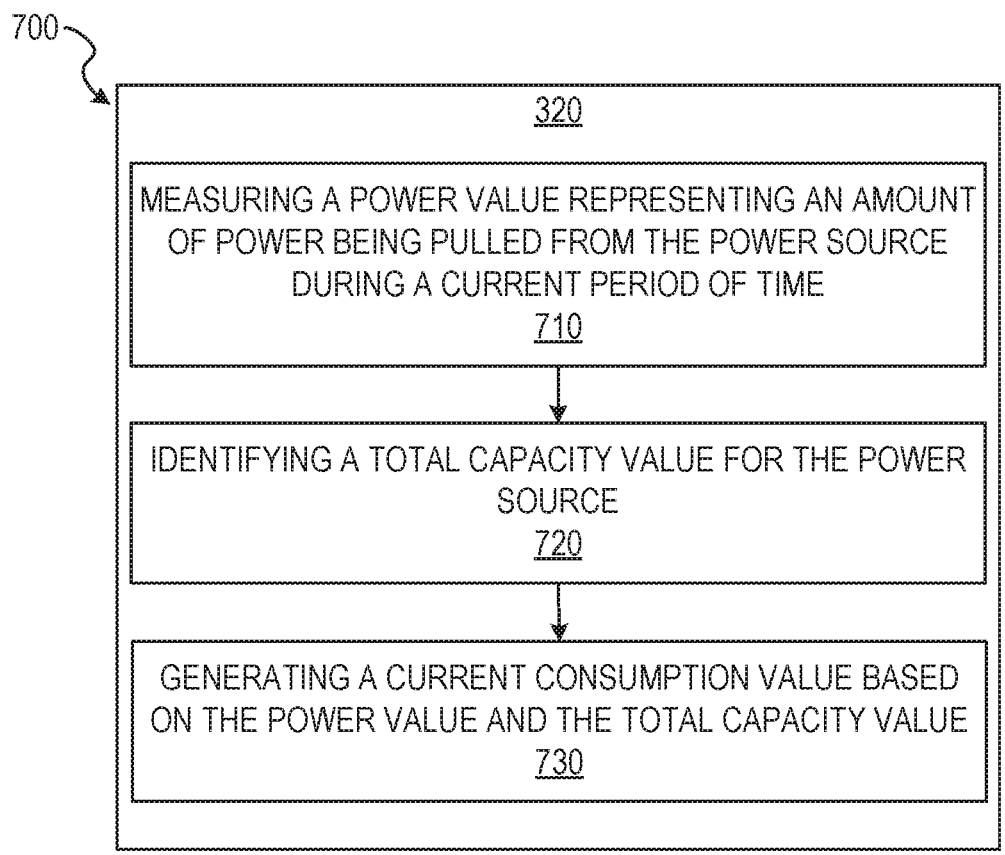
FIG. 7 is a flow diagram illustrating an example method for adaptively estimating power, according to some example embodiments.

FIG. 7 depicts a flow diagram illustrating an example method 700 for adaptively estimating power of a power source. The operations of method 700 may be performed by components of the power estimation system 160. In some instances, certain operations of the method 700 may be performed using one or more operations of the methods 300, 500, or 600, or as sub-operations of one or more operations of the methods 300, 500, or 600, as will be explained in more detail below. For example, as shown in FIG. 7, the method 700 may be performed as a part of operation 320.

In operation 710, the consumption component 220 measures a power value representing an amount of power being pulled from the power source during a current period of time. In some embodiments, the consumption component 220 determines the power value based on the power current and the time sampling rate, as shown above with respect to Equation 1. As described below, the consumption component 220 may also estimate the power being pulled from the power source.

In some embodiments, operation 710 comprises one or more operations or one or more sub-operations. In some instances, in performing operation 710, the consumption component 220 estimates a power current from the power source. The power current may be represented by $I_{PS}$ in Equation 1. In some instances, the consumption component 220 estimates the power current by measuring an instantaneous voltage value, $V_{BAT}$, for the power source. The consumption component 220 may then identify a series resistance value, ESR, of the power source. In response to measuring the instantaneous voltage value and identifying the series resistance value, the consumption component 220 determines the power current based on the instantaneous voltage, the electrical potential value, and the series resistance value. The electrical potential value may be measured as described above with respect to operation 310.

As described above, in some embodiments, the power current $I_{PS}$ may be represented by Equation 5, shown below. $V_{OCV}$ may represent the electrical potential value measured in operation 310.

$$E_{[mAh]} = \frac{V_{OCV} - V_{BAT}}{ESR} \times t_{sampling\ rate} \qquad \text{Equation 5}$$

In some instances, the consumption component 220 identifies a time sampling rate associated with the current period of time. The time sampling rate may be represented by $t_{sampling\ rate}$ in Equation 5. In some instances, the time sampling rate is a unit of time, such as an hour, a minute, a second, or any other suitable rate.

In operation 720, the consumption component 220 identifies a total capacity value for the power source. In some instances, the consumption component 220 identifies the total capacity value from a data structure including characteristics of the power source. For example, the consumption component 220 may identify the total capacity value from a data table providing characteristics of the power source. In some embodiments, the consumption component 220 identifies the total capacity from a memory, a data structure, or a database providing characteristics for the smart glasses 200, including the power source associated with the smart glasses 200. In some embodiments, the total capacity value is represented as $Cap_{[mAh]}$.

In operation 730, the consumption component 220 generates the current consumption value based on the power value and the total capacity value. The current consumption value may be represented as a quotient of the derived power value, $E_{[mAh]}$, divided by the total capacity value, $Cap_{[mAh]}$. In such instances, the current consumption value represents a percent of battery capacity. In some instances the percent of battery capacity may be combined (e.g., multiplied by) with the current slope value identified in operation 330 to generate a correction value for use in generating the current capacity value, similar to that described with respect to operation 350.

Figure 8:
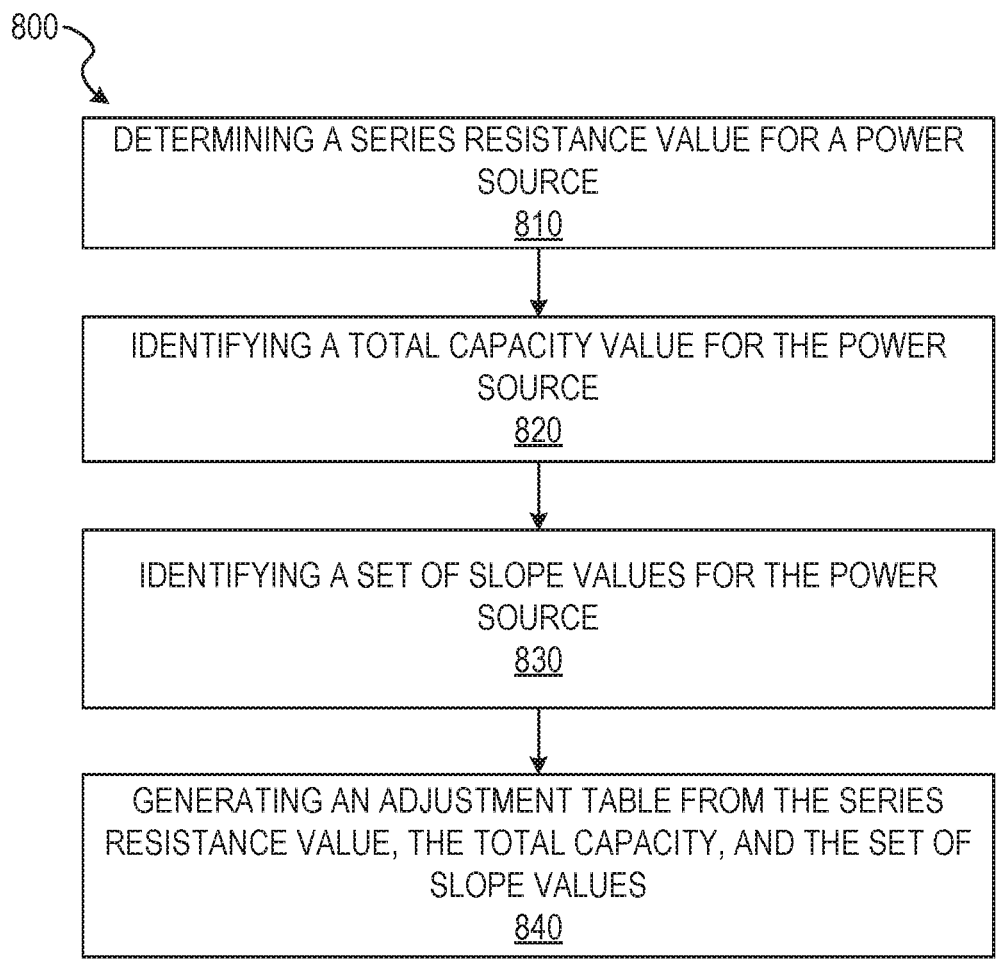
FIG. 8 is a flow diagram illustrating an example method for adaptively estimating power, according to some example embodiments.

FIG. 8 depicts a flow diagram illustrating an example method 800 for adaptively estimating power of a power source. The operations of method 800 may be performed by components of the power estimation system 160. In some instances, certain operations of the method 800 may be performed using one or more operations of the methods 300, 500, 600, or 700 or as sub-operations of one or more operations of the methods 300, 500, 600, or 700, as will be explained in more detail below.

In operation 810, the generation component 250 determines a series resistance value for the power source. The series resistance value may be an equivalent series resistance (ESR) of a cell of the power source. In some embodiments, the generation component 250 determines the ESR by identifying one or more identifying characteristics of a battery, such as a serial number, an identification number, an associated or integral smart glasses 200, or any other identifying information. The generation component 250 may then access one or more database to retrieve the ESR value for the power source. In some instances, the generation component 250 determines the ESR by accessing a data structure, data table, memory, or other suitable information resource coupled to or integral within the smart glasses 200 and identifying the ESR value for the power source stored within the information resource. In some embodiments, the generation component 250 determines the ESR value by directly measuring the ESR value for the power source using one or more sensor.

In operation 820, the generation component 250 identifies a total capacity value for the power source. The generation component 250 may identify the total capacity value in a manner similar to or the same as described above with respect to operation 720. The generation component 250 may identify the total capacity value from reference information in a memory accessible by the generation component 250, directly from the power source, or from the smart glasses 200.

In operation 830, the generation component 250 identifies a set of slope values for the power source. In some embodiments, the set of slope values map a set of electrical potential values to a set of estimated capacity percentages. In some embodiments, the set of slope values for the power source may be identified within a data structure, a database, a memory, or other suitable information resource. In some instances, the information resource may be a set of reference material describing characteristics of the power source, such as information provided by a manufacturer of the power source or a manufacturer of the smart glasses 200. The set of slope values for the power source may be contained in or represented as a single data structure. In some instances, the data structure representing the set of slope values is a OCV/SoC curve associated with the power source, a model of the power source, or the like.

In operation 840, the generation component 250 generates an adjustment table from the series resistance value, the total capacity value, and the set of slope values. The adjustment table may be generated as a table mapping values of the set of slope values to the series resistance value and the total capacity value. In some embodiments, the generation component 250 generates the adjustment table as a set of values corresponding to electrical potential values, where the values are derived from the series resistance value, the total capacity value, and the set of slope values. In some embodiments, values of the adjustment table, for a given electrical potential value, $OCV_{n-1}$, are represented by Equation 6, below.

$$deltaK(OCV_{n-1}) = \frac{ESR \times CAP_{[mAh]}}{\left[\frac{\delta V_{char}}{\delta SoC_{char}}\right]_{V=OCV_{n-1}}} \qquad \text{Equation 6}$$

In Equation 6, $deltaK(OCV_{n-1})$ may be a value within the adjustment table, deltaK, mapped to the electrical potential value $OCV_{n-1}$. As described above, ESR represents an equivalent series resistance value for the power source, $CAP_{[mAh]}$ represents a total capacity for the power source, and $$\left[\frac{\delta V_{char}}{\delta SoC_{char}}\right]_{V=OCV_{n-1}}$$

represents a slope value of the set of slope values associated with or mapped to the electrical potential value. In some embodiments, an adjustment table is associated with and represents a single specified power source. In such instances, the adjustment table is tailored to specific characteristics of the specified power source. Such adjustment tables may vary from power source to power source based on the characteristics particular to the power source.

In some embodiments, the generation component 250 generates a set of correction values, included within the adjustment table. In such instances, a correction value, similar to the correction value described above in operation 340, may be determined from a current consumption value, a power value, and the adjustment table. The power value may indicate an amount of power being pulled from the power source during a current period of time. The correction values may be represented by Equation 7, below.

$$\delta OCV = \frac{V_{BAT} - OCR_{n-1}}{deltaK(OCV_{n-1})} \qquad \text{Equation 7}$$

As noted above, the correction values included in the adjustment table may be a set of correction values. Each correction value of the set of correction values may correspond to an adjustment value of the adjustment table corresponding to a specified electrical potential value. The correction values may be determined or calculated as a quotient of a difference between an instantaneous voltage, $V_{BAT}$, and the electrical potential value, $OCV_{n-1}$, divided by the adjustment value associated with or generated using the electrical potential value.

In some embodiments using the adjustment table deltaK, the power estimation system 160 may estimate a current capacity using the adjustment table in a manner similar to that described above with respect to methods 300, 500, 600, and 700. In some instances, the current capacity value may be represented by Equation 8, below.

$$OCV_n = OCV_{n-1} + \frac{V_{BAT} - OCV_{n-1}}{deltaK(OCV_{n-1})} \quad \text{Equation 8}$$

As shown in Equation 8, $OCV_n$ may represent an estimated current capacity value. $OCV_{n-1}$ may be the electrical potential value, $V_{BAT}$ may be an instantaneous voltage, and $deltaK(OCV_{n-1})$ may be a value within the adjustment table, deltaK, mapped to the electrical potential value $OCV_{n-1}$.

Figure 9:
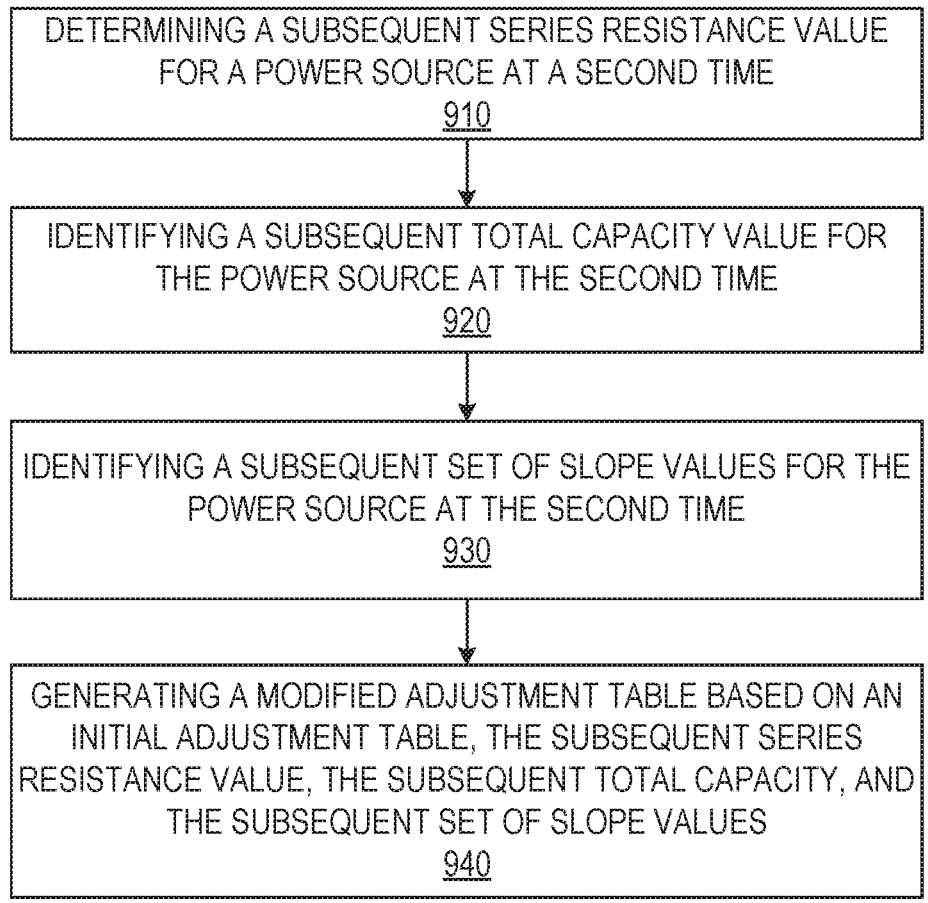
FIG. 9 is a flow diagram illustrating an example method for adaptively estimating power, according to some example embodiments.

FIG. 9 depicts a flow diagram illustrating an example method 900 for adaptively estimating power of a power source. The operations of method 900 may be performed by components of the power estimation system 160. In some instances, certain operations of the method 900 may be performed using one or more operations of the methods 300, 500, 600, 700, or 800, or as sub-operations of one or more operations of the methods 300, 500, 600, 700, or 800, as will be explained in more detail below. For example, the method 900 may be performed as a part of or in response to performance of the method 800.

In some embodiments, values determined in the method 800 are initial values. In such embodiments, the series resistance value may be an initial series resistance value, the total capacity value may be an initial total capacity value, the set of slope values may be an initial set of slope values, and the adjustment table may be an initial adjustment table. The initial series resistance value, the initial total capacity value, and the initial set of slope values are determined at a first time. In operation 910, the generation component 250 determines a subsequent series resistance value for the power source at a second time. In some embodiments, the generation component 250 determines the subsequent resistance value from an information resource providing the series resistance value for the power source. The information resource may include a set of series resistance values associated with one or more of an age, a usage, a number of charging cycles, or other characteristics of the power source. The generation component 250 may determine the series resistance value from the set of series resistance values by matching one or more current characteristic of the power source with the characteristics of the power source indicated within the information resource and mapped to the determined series resistance value. In some embodiments, the generation component 250 measures or derives the subsequent series resistance value or subsequent ESR value from the power source directly. In some instances, the generation component 250 determines the subsequent series resistance value in a manner similar to or the same as described above with respect to operation 810, described above.

In operation 920, the generation component 250 identifies a subsequent capacity value for the power source at the second time. In some embodiments, the generation component 250 identifies the subsequent capacity value for the power source in a manner similar to or the same as described above with respect to operation 820. The generation component 250, in identifying the subsequent capacity value for the power source at the second time, may identify one or more characteristics, such as an age, a usage, number of charging cycles, or other suitable characteristics. The generation component 250 may match or compare the one or more characteristics to capacity values in an information resource and select the corresponding capacity value associated with the one or more characteristics. In some instances, the generation component 250 may measure or derive the subsequent capacity value from the power source directly.

In operation 930, the generation component 250 identifies a subsequent set of slope values for the power source at the second time. In some embodiments, the generation component 250 identifies the subsequent set of slope values for the power source in a manner similar to or the same as described above with respect to operation 830. In some instances, the generation component 250 identifies the subsequent set of slope values from an information resource for the power source based on characteristics of the power source at the second time.

In operation 940, the generation component 250 generates a modified adjustment table based on the initial adjustment table and one or more changes between the initial series resistance value and the subsequent series resistance value, the initial total capacity value and the subsequent capacity value, and the initial set of slope values and the subsequent set of slope values. The modified adjustment table may represent and reflect changes in the power source (e.g., a smartphone battery) which occur based on usage, a number of charging cycles, age or time of use, damage, or any other situations modifying the operation or characteristics of the power source. The generation component 250 may generate the modified adjustment table from the subsequent values obtained in operations 910, 920, and 930 in a manner similar to or the same as described above with respect to operation 840. In some embodiments, the generation component 250 generates the modified adjustment table from the above-referenced subsequent values and the initial adjustment table, modifying one or more of the adjustment values and the correction values to reflect changes in the power source, chemistry underlying the power source, or characteristics of the power source having changed between the first time of the initial values and the second time of the subsequent values. The generation component 250 may modify the adjustment table on a periodic basis (e.g., according to a time interval), a constant or continual basis, on an episodic basis (e.g., in response to triggering events), or any other suitable basis. As described, the adjustment table or modified adjustment table may be calibrated to a particular power source and reflect unique qualities of the power source such as age, usage, charging cycles, and other relevant factors. In some instances, the adjustment table or an initial adjustment table may be generated with respect to categories or models of power sources, and be tailored to specific units of the category or model of power source over time as characteristics of the specific unit change.

Previous systems and methods for estimating power in a power source or battery may be imprecise, inaccurate, or incorporate errors. Reliance on singular voltage measurements or estimations and limited resolution OCV/SoC curves may provide inaccurate indications of battery life or current capacities of power sources, making reliance on such estimations for use in shut down, suspension, and other automated device operations prone to error. Incorporation of additional sensors, circuitry, or components dedicated to measurement of power sources may be precluded by mobile device sizes, dimensions, and component distribution. Similarly, such sensors may be prone to limitations in placement within smart glasses due to interference or temperatures generated by other components. Further, previous systems and methods for estimating power are often subject to errors arising from temperature variations and lack of monotonicity. As such, previous systems and methods present technical issues with respect to mobile device design, power and capacity measurement, and power estimation, among others. As described herein, embodiments of the present disclosure may address or provide technical solutions to one or more of the described technical problems, among others not explicitly listed. Although described with respect to specified technical problems and technical solutions, it should be understood that the present description is not solely limited to the recited problems and solutions. Embodiments described herein may also address additional technical problems and provide additional technical solutions, without limitation.

Modules, Components, and Logic

Certain embodiments are described herein as including logic or a number of components, modules, or mechanisms. Components can constitute hardware components. A "hardware component" is a tangible unit capable of performing certain operations and can be configured or arranged in a certain physical manner. In various example embodiments, computer systems (e.g., a standalone computer system, a client computer system, or a server computer system) or hardware components of a computer system (e.g., at least one hardware processor, a processor, or a group of processors) is configured by software (e.g., an application or application portion) as a hardware component that operates to perform certain operations as described herein.

In some embodiments, a hardware component is implemented mechanically, electronically, or any suitable combination thereof. For example, a hardware component can include dedicated circuitry or logic that is permanently configured to perform certain operations. For example, a hardware component can be a special-purpose processor, such as a Field-Programmable Gate Array (FPGA) or an Application Specific Integrated Circuit (ASIC). A hardware component may also include programmable logic or circuitry that is temporarily configured by software to perform certain operations. For example, a hardware component can include software encompassed within a general-purpose processor or other programmable processor. It will be appreciated that the decision to implement a hardware component mechanically, in dedicated and permanently configured circuitry, or in temporarily configured circuitry (e.g., configured by software) can be driven by cost and time considerations.

Accordingly, the phrase "hardware component" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented component" refers to a hardware component. Considering embodiments in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software can accordingly configure a particular processor or processors, for example, to constitute a particular hardware component at one instance of time and to constitute a different hardware component at a different instance of time.

Hardware components can provide information to, and receive information from, other hardware components. Accordingly, the described hardware components can be regarded as being communicatively coupled. Where multiple hardware components exist contemporaneously, communications can be achieved through signal transmission (e.g., over appropriate circuits and buses) between or among two or more of the hardware components. In embodiments in which multiple hardware components are configured or instantiated at different times, communications between such hardware components may be achieved, for example, through the storage and retrieval of information in memory structures to which the multiple hardware components have access. For example, one hardware component performs an operation and stores the output of that operation in a memory device to which it is communicatively coupled. A further hardware component can then, at a later time, access the memory device to retrieve and process the stored output. Hardware components can also initiate communications with input or output devices, and can operate on a resource (e.g., a collection of information).

The various operations of example methods described herein can be performed, at least partially, by processors that are temporarily configured (e.g., by software) or permanently configured to perform the relevant operations. Whether temporarily or permanently configured, such processors constitute processor-implemented components that operate to perform operations or functions described herein. As used herein, "processor-implemented component" refers to a hardware component implemented using processors.

Similarly, the methods described herein can be at least partially processor-implemented, with a particular processor or processors being an example of hardware. For example, at least some of the operations of a method can be performed by processors or processor-implemented components. Moreover, the processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via appropriate interfaces (e.g., an Application Program Interface (API)).

The performance of certain of the operations may be distributed among the processors, not only residing within a single machine, but deployed across a number of machines. In some example embodiments, the processors or processor-implemented components are located in a single geographic location (e.g., within a home environment, an office environment, or a server farm). In other example embodiments, the processors or processor-implemented components are distributed across a number of geographic locations.

Applications

Figure 10:
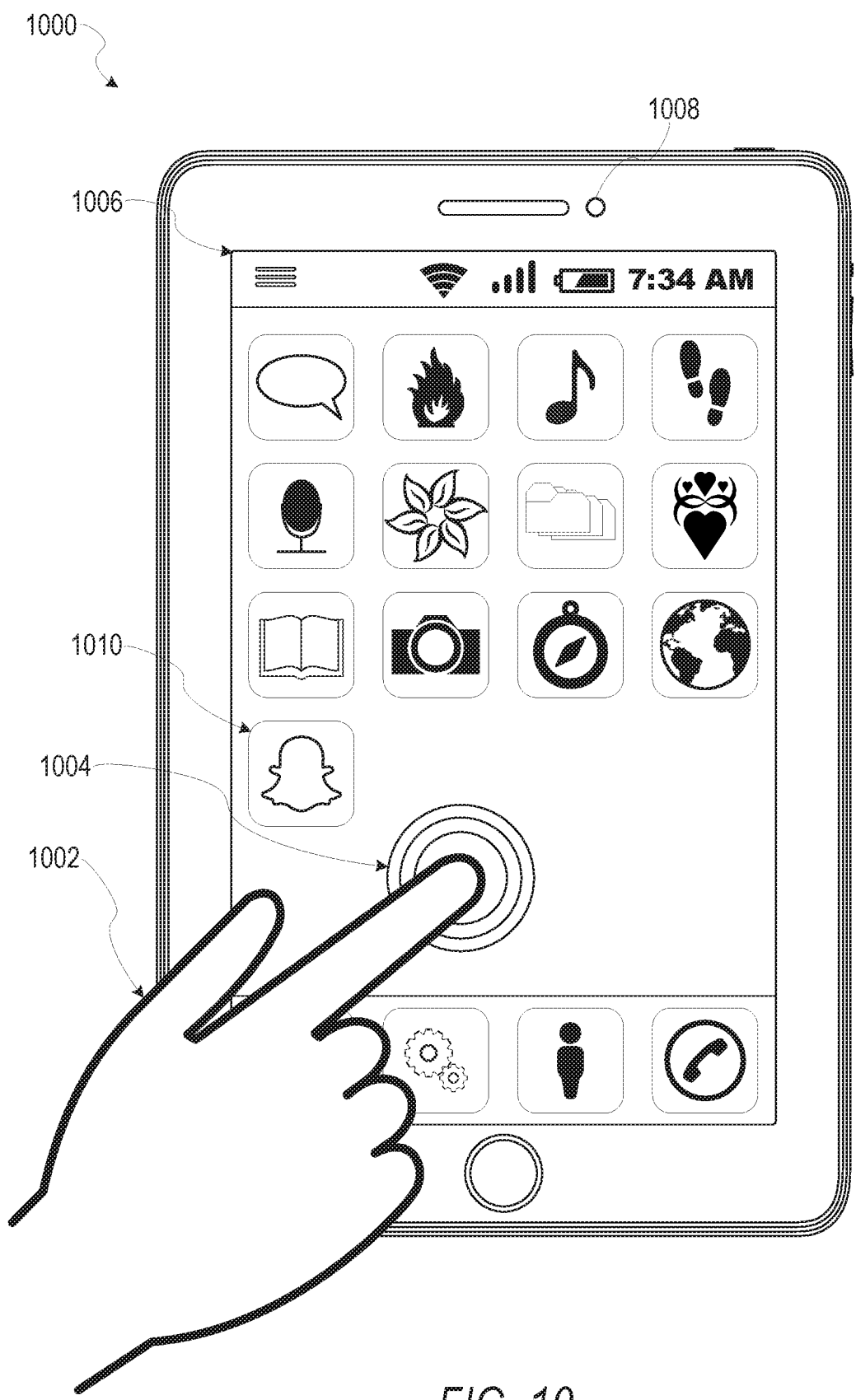
FIG. 10 is a user interface diagram depicting an example mobile device and mobile operating system interface, according to some example embodiments.

FIG. 10 illustrates an example mobile device 1000 executing a mobile operating system (e.g., IOS™, ANDROID™, WINDOWS® Phone, or other mobile operating systems), consistent with some embodiments. In one embodiment, the mobile device 1000 includes a touch screen operable to receive tactile data from a user 1002. For instance, the user 1002 may physically touch 1004 the mobile device 1000, and in response to the touch 1004, the mobile device 1000 may determine tactile data such as touch location, touch force, or gesture motion. In various example embodiments, the mobile device 1000 displays a home screen 1006 (e.g., Springboard on IOS™) operable to launch applications or otherwise manage various aspects of the mobile device 1000. In some example embodiments, the home screen 1006 provides status information such as battery life, connectivity, or other hardware statuses. The user 1002 can activate user interface elements by touching an area occupied by a respective user interface element. In this manner, the user 1002 interacts with the applications of the mobile device 1000. For example, touching the area occupied by a particular icon included in the home screen 1006 causes launching of an application corresponding to the particular icon.

The mobile device 1000, as shown in FIG. 10, includes an imaging device 1008. The imaging device 1008 may be a camera or any other device coupled to the mobile device 1000 capable of capturing a video stream or one or more successive images. The imaging device 1008 may be triggered by the power estimation system 160 or a selectable user interface element to initiate capture of a video stream or succession of images and pass the video stream or succession of images to the power estimation system 160 for processing according to the one or more methods described in the present disclosure.

Many varieties of applications (also referred to as "apps") can be executing on the mobile device 1000, such as native applications (e.g., applications programmed in Objective-C, Swift, or another suitable language running on IOS™, or applications programmed in Java running on ANDROID™), mobile web applications (e.g., applications written in Hypertext Markup Language-5 (HTML5)), or hybrid applications (e.g., a native shell application that launches an HTML5 session). For example, the mobile device 1000 includes a messaging app, an audio recording app, a camera app, a book reader app, a media app, a fitness app, a file management app, a location app, a browser app, a settings app, a contacts app, a telephone call app, or other apps (e.g., gaming apps, social networking apps, biometric monitoring apps). In another example, the mobile device 1000 includes a social messaging app 1010 such as SNAPCHAT® that, consistent with some embodiments, allows users to exchange ephemeral messages that include media content. In this example, the social messaging app 1010 can incorporate aspects of embodiments described herein. For example, in some embodiments the social messaging application includes an ephemeral gallery of media created by users of the social messaging application. These galleries may consist of videos or pictures posted by a user and made viewable by contacts (e.g., "friends") of the user. Alternatively, public galleries may be created by administrators of the social messaging application consisting of media from any users of the application (and accessible by all users). In yet another embodiment, the social messaging application may include a "magazine" feature which consists of articles and other content generated by publishers on the social messaging application's platform and accessible by any users. Any of these environments or platforms may be used to implement concepts of the present inventive subject matter.

In some embodiments, an ephemeral message system may include messages having ephemeral video clips or images which are deleted following a deletion trigger event such as a viewing time or viewing completion. In such embodiments, smart glasses implementing the power estimation system 160 may adaptively estimate power within a power source of the smart glasses and determine whether to process, capture, or transmit image, video, or audio data to the ephemeral message system or a mobile computing device communicating with the ephemeral message system, or suspend processing, capturing, or transmission of the data based on the current capacity value of the power source.

Software Architecture

Figure 11:
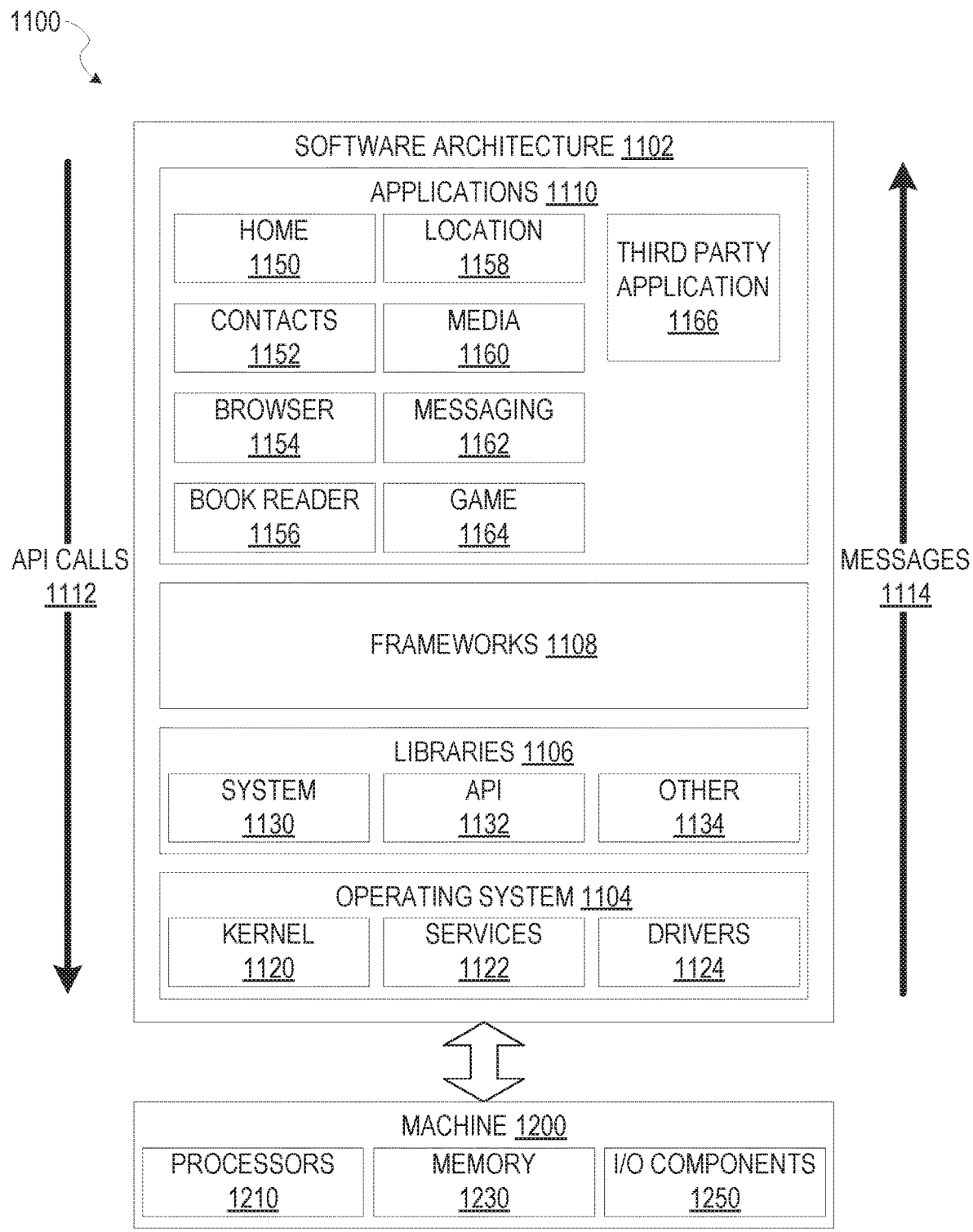
FIG. 11 is a block diagram illustrating an example of a software architecture that may be installed on a machine, according to some example embodiments.

FIG. 11 is a block diagram 1100 illustrating an architecture of software 1102, which can be installed on the devices described above. FIG. 11 is merely a non-limiting example of a software architecture, and it will be appreciated that many other architectures can be implemented to facilitate the functionality described herein. In various embodiments, the software 1102 is implemented by hardware such as machine a 1200 of FIG. 12 that includes processors 1210, memory 1230, and I/O components 1250. In this example architecture, the software 1102 can be conceptualized as a stack of layers where each layer may provide a particular functionality. For example, the software 1102 includes layers such as an operating system 1104, libraries 1106, frameworks 1108, and applications 1110. Operationally, the applications 1110 invoke application programming interface (API) calls 1112 through the software stack and receive messages 1114 in response to the API calls 1112, consistent with some embodiments.

In various implementations, the operating system 1104 manages hardware resources and provides common services. The operating system 1104 includes, for example, a kernel 1120, services 1122, and drivers 1124. The kernel 1120 acts as an abstraction layer between the hardware and the other software layers consistent with some embodiments. For example, the kernel 1120 provides memory management, processor management (e.g., scheduling), component management, networking, and security settings, among other functionality. The services 1122 can provide other common services for the other software layers. The drivers 1124 are responsible for controlling or interfacing with the underlying hardware, according to some embodiments. For instance, the drivers 1124 can include display drivers, camera drivers. BLUETOOTH® drivers, flash memory drivers, serial communication drivers (e.g., Universal Serial Bus (USB) drivers), WI-FI® drivers, audio drivers, power management drivers, and so forth.

In some embodiments, the libraries 1106 provide a low-level common infrastructure utilized by the applications 1110. The libraries 1106 can include system libraries 1130 (e.g., C standard library) that can provide functions such as memory allocation functions, string manipulation functions, mathematic functions, and the like. In addition, the libraries 1106 can include API libraries 1132 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC). Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like. The libraries 1106 can also include a wide variety of other libraries 1134 to provide many other APIs to the applications 1110.

The frameworks 1108 provide a high-level common infrastructure that can be utilized by the applications 1110, according to some embodiments. For example, the frameworks 1108 provide various graphic user interface (GUI) functions, high-level resource management, high-level location services, and so forth. The frameworks 1108 can provide a broad spectrum of other APIs that can be utilized by the applications 1110, some of which may be specific to a particular operating system or platform.

In an example embodiment, the applications 1110 include a home application 1150, a contacts application 1152, a browser application 1154, a book reader application 1156, a location application 1158, a media application 1160, a messaging application 1162, a game application 1164, and a broad assortment of other applications such as a third-party application 1166. According to some embodiments, the applications 1110 are programs that execute functions defined in the programs. Various programming languages can be employed to create the applications 1110, structured in a variety of manners, such as object-oriented programming languages (e.g., Objective-C, Java, or C++) or procedural programming languages (e.g., C or assembly language). In a specific example, the third-party application 1166 (e.g., an application developed using the ANDROID™ or IOS™ software development kit (SDK) by an entity other than the vendor of the particular platform) may be mobile software running on a mobile operating system such as IOS™, ANDROID™, WINDOWS® PHONE, or another mobile operating systems. In this example, the third-party application 1166 can invoke the API calls 1112 provided by the operating system 1104 to facilitate functionality described herein.

Example Machine Architecture and Machine-Readable Medium

Figure 12:
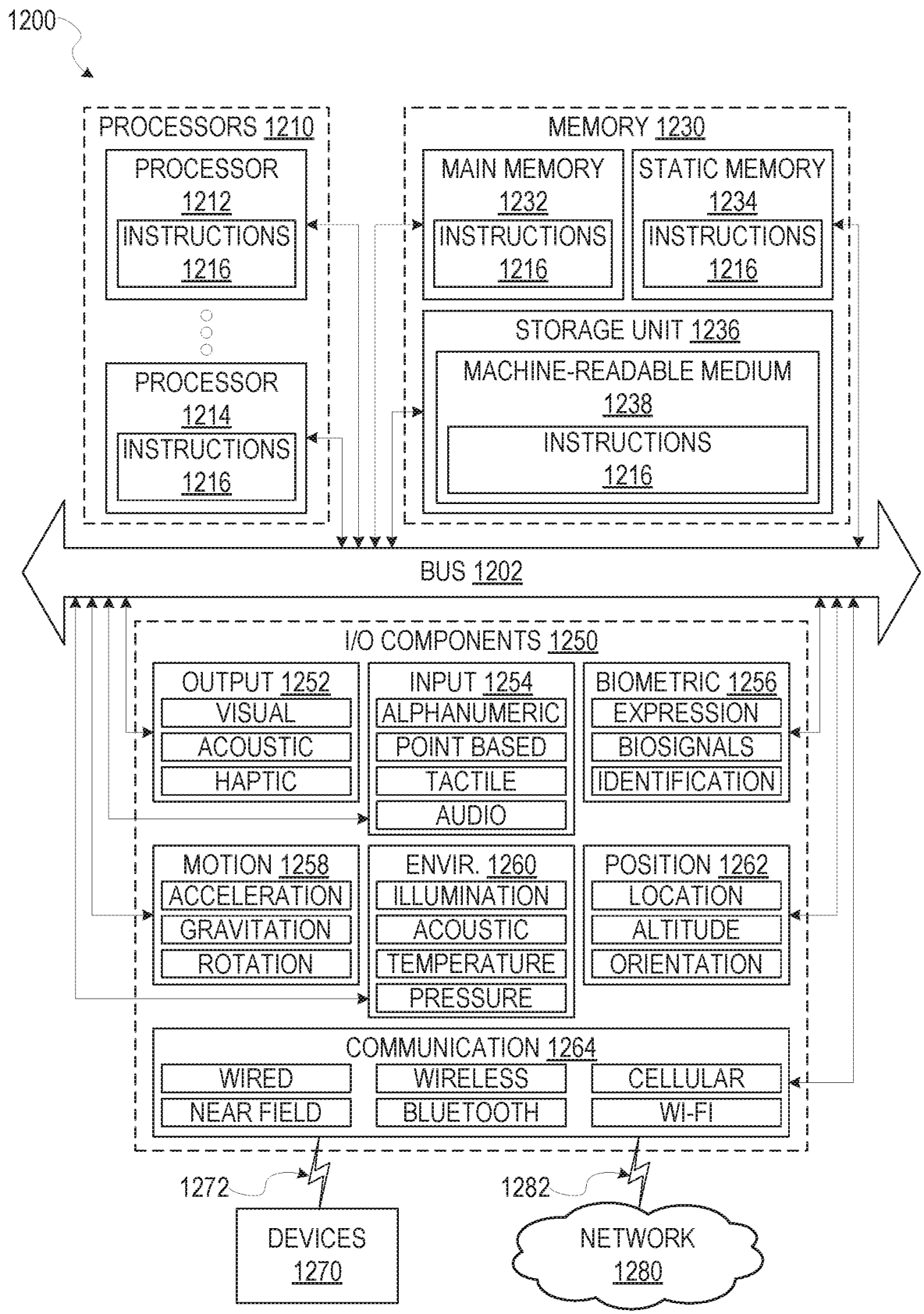
FIG. 12 is a block diagram presenting a diagrammatic representation of a machine in the form of a computer system within which a set of instructions may be executed for causing the machine to perform any of the methodologies discussed herein, according to an example embodiment.

FIG. 12 is a block diagram illustrating components of a machine 1200, according to some embodiments, able to read instructions (e.g., processor executable instructions) from a machine-readable medium (e.g., a non-transitory machine-readable storage medium or non-transitory processor-readable storage medium) and perform any of the methodologies discussed herein. Specifically, FIG. 12 shows a diagrammatic representation of the machine 1200 in the example form of a computer system, within which instructions 1216 (e.g., software, a program, an application, an applet, an app, or other executable code) for causing the machine 1200 to perform any of the methodologies discussed herein can be executed. In alternative embodiments, the machine 1200 operates as a standalone device or can be coupled (e.g., networked) to other machines. In a networked deployment, the machine 1200 may operate in the capacity of a server machine or a client machine in a server-client network environment, or as a peer machine in a peer-to-peer (or distributed) network environment. The machine 1200 can comprise, but not be limited to, a server computer, a client computer, a personal computer (PC), a tablet computer, a laptop computer, a netbook, a set-top box (STB), a personal digital assistant (PDA), an entertainment media system a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1216, sequentially or otherwise, that specify actions to be taken by the machine 1200. Further, while only a single machine 1200 is illustrated, the term "machine" shall also be taken to include a collection of machines 1200 that individually or jointly execute the instructions 1216 to perform any of the methodologies discussed herein.

In various embodiments, the machine 1200 comprises processors 1210, memory 1230, and I/O components 1250, which can be configured to communicate with each other via a bus 1202. In an example embodiment, the processors 1210 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) include, for example, a processor 1212 and a processor 1214 that may execute the instructions 1216. The term "processor" is intended to include multi-core processors that may comprise two or more independent processors (also referred to as "cores") that can execute instructions 1216 contemporaneously. Although FIG. 12 shows multiple processors 1210, the machine 1200 may include a single processor with a single core, a single processor with multiple cores (e.g., a multi-core processor), multiple processors with a single core, multiple processors with multiples cores, or any combination thereof.

The memory 1230 comprises a main memory 1232, a static memory 1234, and a storage unit 1236 accessible to the processors 1210 via the bus 1202, according to some embodiments. The storage unit 1236 can include a machine-readable medium 1238 on which are stored the instructions 1216 embodying any of the methodologies or functions described herein. The instructions 1216 can also reside, completely or at least partially, within the main memory 1232, within the static memory 1234, within at least one of the processors 1210 (e.g., within the processor's cache memory), or any suitable combination thereof, during execution thereof by the machine 1200. Accordingly, in various embodiments, the main memory 1232, the static memory 1234, and the processors 1210 are considered machine-readable media 1238.

As used herein, the term "memory" refers to a machine-readable medium 1238 able to store data temporarily or permanently and may be taken to include, but not be limited to, random-access memory (RAM), read-only memory (ROM), buffer memory, flash memory, and cache memory. While the machine-readable medium 1238 is shown in an example embodiment to be a single medium, the term "machine-readable medium" should be taken to include a single medium or multiple media (e.g., a centralized or distributed database, or associated caches and servers) able to store the instructions 1216. The term "machine-readable medium" shall also be taken to include any medium, or combination of multiple media, that is capable of storing instructions (e.g., instructions 1216) for execution by a machine (e.g., machine 1200), such that the instructions, when executed by processors of the machine 1200 (e.g., processors 1210), cause the machine 1200 to perform any of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, data repositories in the form of a solid-state memory (e.g., flash memory), an optical medium, a magnetic medium, other non-volatile memory (e.g., Erasable Programmable Read-Only Memory (EPROM)), or any suitable combination thereof. The term "machine-readable medium" specifically excludes non-statutory signals per se.

The I/O components 1250 include a wide variety of components to receive input, provide output, produce output, transmit information, exchange information, capture measurements, and so on. In general, it will be appreciated that the I/O components 1250 can include many other components that are not shown in FIG. 12. The I/O components 1250 are grouped according to functionality merely for simplifying the following discussion, and the grouping is in no way limiting. In various example embodiments, the I/O components 1250 include output components 1252 and input components 1254. The output components 1252 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1254 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some further example embodiments, the I/O components 1250 include biometric components 1256, motion components 1258, environmental components 1260, or position components 1262, among a wide array of other components. For example, the biometric components 1256 include components to detect expressions (e.g., hand expressions, facial expressions, vocal expressions, body gestures, or mouth gestures), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 1258 include acceleration sensor components (e.g., accelerometer), gravitation sensor components, rotation sensor components (e.g., gyroscope), and so forth. The environmental components 1260 include, for example, illumination sensor components (e.g., photometer), temperature sensor components (e.g., thermometers that detect ambient temperature), humidity sensor components, pressure sensor components (e.g., barometer), acoustic sensor components (e.g., microphones that detect background noise), proximity sensor components (e.g., infrared sensors that detect nearby objects), gas sensor components (e.g., machine olfaction detection sensors, gas detection sensors to detect concentrations of hazardous gases for safety or to measure pollutants in the atmosphere), or other components that may provide indications, measurements, or signals corresponding to a surrounding physical environment. The position components 1262 include location sensor components (e.g., a Global Positioning System (GPS) receiver component), altitude sensor components (e.g., altimeters or barometers that detect air pressure from which altitude may be derived), orientation sensor components (e.g., magnetometers), and the like.

Communication can be implemented using a wide variety of technologies. The I/O components 1250 may include communication components 1264 operable to couple the machine 1200 to a network 1280 or devices 1270 via a coupling 1282 and a coupling 1272, respectively. For example, the communication components 1264 include a network interface component or another suitable device to interface with the network 1280. In further examples, communication components 1264 include wired communication components, wireless communication components, cellular communication components, Near Field Communication (NFC) components, BLUETOOTH® components (e.g., BLUETOOTH® Low Energy), WI-FI® components, and other communication components to provide communication via other modalities. The devices 1270 may be another machine or any of a wide variety of peripheral devices (e.g., a peripheral device coupled via a Universal Serial Bus (USB)).

Moreover, in some embodiments, the communication components 1264 detect identifiers or include components operable to detect identifiers. For example, the communication components 1264 include Radio Frequency Identification (RFID) tag reader components, NFC smart tag detection components, optical reader components (e.g., an optical sensor to detect a one-dimensional bar codes such as a Universal Product Code (UPC) bar code, multi-dimensional bar codes such as a Quick Response (QR) code, Aztec Code, Data Matrix, Dataglyph, MaxiCode, PDF417, Ultra Code, Uniform Commercial Code Reduced Space Symbology (UCC RSS)-2D bar codes, and other optical codes), acoustic detection components (e.g., microphones to identify tagged audio signals), or any suitable combination thereof. In addition, a variety of information can be derived via the communication components 1264, such as location via Internet Protocol (IP) geo-location, location via WI-FI® signal triangulation, location via detecting a BLUETOOTH® or NFC beacon signal that may indicate a particular location, and so forth.

Transmission Medium

In various example embodiments, portions of the network 1280 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a WI-FI® network, another type of network, or a combination of two or more such networks. For example, the network 1280 or a portion of the network 1280 may include a wireless or cellular network, and the coupling 1282 may be a Code Division Multiple Access (CDMA) connection, a Global System for Mobile communications (GSM) connection, or another type of cellular or wireless coupling. In this example, the coupling 1282 can implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

In example embodiments, the instructions 1216 are transmitted or received over the network 1280 using a transmission medium via a network interface device (e.g., a network interface component included in the communication components 1264) and utilizing any one of a number of well-known transfer protocols (e.g., Hypertext Transfer Protocol (HTTP)). Similarly, in other example embodiments, the instructions 1216 are transmitted or received using a transmission medium via the coupling 1272 (e.g., a peer-to-peer coupling) to the devices 1270. The term "transmission medium" shall be taken to include any intangible medium that is capable of storing, encoding, or carrying the instructions 1216 for execution by the machine 1200, and includes digital or analog communications signals or other intangible media to facilitate communication of such software.

Furthermore, the machine-readable medium 1238 is non-transitory (in other words, not having any transitory signals) in that it does not embody a propagating signal. However, labeling the machine-readable medium 1238 "non-transitory" should not be construed to mean that the medium is incapable of movement; the medium should be considered as being transportable from one physical location to another. Additionally, since the machine-readable medium 1238 is tangible, the medium may be considered to be a machine-readable device.

Language

Throughout this specification, plural instances may implement components, operations, or structures described as a single instance. Although individual operations of methods are illustrated and described as separate operations, individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A method, comprising:
    measuring, by a sensor component of a wearable computing device, an electrical potential of a power source coupled to the wearable computing device, the electrical potential represented by an electrical potential value;
    determining, by one or more processors coupled to the wearable computing device, a first power consumption on the power source, the first power consumption represented by a first consumption value;
    based on the electrical potential value, identifying, by the one or more processors, a first slope value mapping the electrical potential value to an estimated capacity percentage;
    from the first power consumption and the first slope value, determining a correction value;
    generating, by the one or more processors, a first capacity value from the electrical potential value and the correction value; and
    causing display of a representation of the first capacity value within a power indicator positioned on the wearable computing device, the representation of the first capacity value displayed according to a device setting of the wearable computing device.

2. The method of claim 1, further comprising:
    measuring a first temperature of the power source;
    based on the first temperature, determining a temperature adjustment value for the first power consumption on the power source;
    generating a modified power consumption value from the first consumption value and the temperature adjustment value; and
    generating the correction value from the modified power consumption value and the first slope value.

3. The method of claim 1, wherein the first capacity value is generated at a first time, the method further comprising:
    generating a second capacity value at a second time, the second capacity value generated from a second electrical potential value, a second power consumption value, a second slope value, and a second correction value;
    determining the second capacity value exceeds the first capacity value;
    determining a connection status of the power source to a power supply device, the connection status indicating the power source is unconnected to the power supply device; and
    modifying the second capacity value to correspond to the first capacity value.

4. The method of claim 1, wherein determining the first consumption value further comprises:
    measuring a power value representing an amount of power being pulled from the power source during a first period of time;
    identifying a total capacity value for the power source; and
    generating the first consumption value based on the power value and the total capacity value.

5. The method of claim 4, wherein measuring the power value further comprises:
    estimating a power current for the power source;
    identifying a time sampling rate associated with the first period of time; and
    determining the power value based on the power current and the time sampling rate.

6. The method of claim 5, wherein estimating the power current further comprises:
    measuring an instantaneous voltage value for the power source;
    identifying a series resistance value of the power source; and
    determining the power current based on the instantaneous voltage value, the electrical potential value, and the series resistance value.

7. The method of claim 1 further comprising:
    determining a series resistance value for the power source;
    identifying a total capacity value for the power source;
    identifying a set of slope values for the power source, the set of slope values mapping a set of electrical potential values to a set of estimated capacity percentages; and
    generating an adjustment table from the series resistance value, the total capacity value, and the set of slope values.

8. The method of claim 7, wherein the correction value is determined from the first consumption value, a power value, and the adjustment table, the power value indicating an amount of power being pulled from the power source during a first period of time.

9. The method of claim 7, wherein the series resistance value is an initial series resistance value, the total capacity value is an initial total capacity value, the set of slope values are an initial set of slope values, and the adjustment table is an initial adjustment table, the initial series resistance value, the initial total capacity value, and the initial set of slope values are determined at a first time, the method further comprising:
    determining a subsequent series resistance value for the power source at a second time;
    identifying a subsequent capacity value for the power source at the second time;
    identifying a subsequent set of slope values for the power source at the second time; and
    generating a modified adjustment table based on the initial adjustment table and one or more changes between the initial series resistance value and the subsequent series resistance value, the initial total capacity value and the subsequent capacity value, and the initial set of slope values and the subsequent set of slope values.

10. The method of claim 1, further comprising:
    identifying one or more processes operating within the wearable computing device; and
    generating an interrupt suspending at least one of the one or more processes operating within the wearable computing device based on the first capacity value.

11. A system, comprising:
    one or more processors; and
    a non-transitory processor-readable storage medium storing processor-executable instructions that, when executed by the one or more processors, cause the one or more processors to perform operations comprising:
    measuring, by a sensor component of a wearable computing device, an electrical potential of a power source coupled to the wearable computing device, the electrical potential represented by an electrical potential value, the one or more processors coupled to the wearable computing device;
    determining, by the one or more processors, a first power consumption on the power source, the first power consumption represented by a first consumption value;
    based on the electrical potential value, identifying, by the one or more processors, a first slope value mapping the electrical potential value to an estimated capacity percentage;
    from the first power consumption and the first slope value, determining a correction value;
    generating, by the one or more processors, a first capacity value from the electrical potential value and the correction value; and
    causing display of a representation of the first capacity value within a power indicator positioned on the wearable computing device, the representation of the first capacity value displayed according to a device setting of the wearable computing device.

12. The system of claim 11, wherein the first capacity value is generated at a first time, the operations further comprise:
    generating a second capacity value at a second time, the second capacity value generated from a second electrical potential value, a second power consumption value, a second slope value, and a second correction value;
    determining the second capacity value exceeds the first capacity value;
    determining a connection status of the power source to a power supply device, the connection status indicating the power source is unconnected to the power supply device; and
    modifying the second capacity value to correspond to the first capacity value.

13. The system of claim 11, wherein determining the first consumption value further comprises:
    measuring a power value representing an amount of power being pulled from the power source during a first period of time;
    identifying a total capacity value for the power source; and
    generating the first consumption value based on the power value and the total capacity value.

14. The system of claim 13, wherein measuring the power value further comprises:
    estimating a power current for the power source;
    identifying a time sampling rate associated with the first period of time; and
    determining the power value based on the power current and the time sampling rate.

15. The system of claim 11, wherein the operations further comprise:
    determining a series resistance value for the power source;
    identifying a total capacity value for the power source;
    identifying a set of slope values for the power source, the set of slope values mapping a set of electrical potential values to a set of estimated capacity percentages; and
    generating an adjustment table from the series resistance value, the total capacity value, and the set of slope values.

16. The system of claim 11, wherein the operations further comprise:
    identifying one or more processes operating within the wearable computing device; and generating an interrupt suspending at least one of the one or more processes operating within the wearable computing device based on the first capacity value.

17. A non-transitory processor-readable storage medium storing processor-executable instructions that, when executed by a processor of a machine, cause the machine to perform operations comprising:

measuring, by a sensor component coupled to the non-transitory processor-readable storage medium, an electrical potential of a power source coupled to a wearable computing device, the electrical potential represented by an electrical potential value;

determining, by one or more processors coupled to the non-transitory processor-readable storage medium, a first power consumption on the power source, the first power consumption represented by a first consumption value;

based on the electrical potential value, identifying, by the one or more processors, a first slope value mapping the electrical potential value to an estimated capacity percentage;

from the first power consumption and the first slope value, determining a correction value;

generating, by the one or more processors, a first capacity value from the electrical potential value and the correction value; and causing display of a representation of the first capacity value within a power indicator positioned on the wearable computing device, the representation of the first capacity value displayed according to a device setting of the wearable computing device.

18. The non-transitory processor-readable storage medium of claim 17, wherein determining the first consumption value further comprises:

measuring a power value representing an amount of power being pulled from the power source during a first period of time;

identifying a total capacity value for the power source; and generating the first consumption value based on the power value and the total capacity value.

19. The non-transitory processor-readable storage medium of claim 17, wherein the operations further comprise:

determining a series resistance value for the power source;

identifying a total capacity value for the power source;

identifying a set of slope values for the power source, the set of slope values mapping a set of electrical potential values to a set of estimated capacity percentages; and generating an adjustment table from the series resistance value, the total capacity value, and the set of slope values.

20. The non-transitory processor-readable storage medium of claim 17, wherein the operations further comprise:

identifying one or more processes operating within the wearable computing device; and generating an interrupt suspending at least one of the one or more processes operating within the wearable computing device based on the first capacity value.

* * * * *